(12) United States Patent
Li et al.

(10) Patent No.: US 12,355,325 B2
(45) Date of Patent: Jul. 8, 2025

(54) SYSTEM, ELECTROMAGNETIC ACTUATOR AND TRACK FOR BRAKING

(71) Applicant: HYPERLOOP TECHNOLOGIES, INC., Los Angeles, CA (US)

(72) Inventors: Yingjie Li, Los Angeles, CA (US); Arbi Gharakhani Siraki, Los Angeles, CA (US); Rachel Ozer, Los Angeles, CA (US); Shahriyar Beizaee, Los Angeles, CA (US); Erik Johnson, Los Angeles, CA (US)

(73) Assignee: HYPERLOOP TECHNOLOGIES, INC., Los Angeles, CA (US)

( * ) Notice: Subject to any disclaimer, the term of this patent is extended or adjusted under 35 U.S.C. 154(b) by 554 days.

(21) Appl. No.: 17/773,940

(22) PCT Filed: Nov. 5, 2020

(86) PCT No.: PCT/US2020/059017
§ 371 (c)(1),
(2) Date: May 3, 2022

(87) PCT Pub. No.: WO2021/092111
PCT Pub. Date: May 14, 2021

(65) Prior Publication Data
US 2022/0385162 A1   Dec. 1, 2022

Related U.S. Application Data

(60) Provisional application No. 62/945,978, filed on Dec. 10, 2019, provisional application No. 62/931,935, (Continued)

(51) Int. Cl.
*H02K 41/03*   (2006.01)
*H01F 7/06*    (2006.01)
(Continued)

(52) U.S. Cl.
CPC ............. *H02K 41/03* (2013.01); *H01F 7/064* (2013.01); *H01F 7/081* (2013.01); *H01F 27/28* (2013.01);
(Continued)

(58) Field of Classification Search
CPC .......... H02K 41/03; H02K 1/14; H02K 1/143; H02K 1/18; H02K 1/20; H02K 3/04;
(Continued)

(56) References Cited

U.S. PATENT DOCUMENTS 893,711 A    7/1908  Cushman
4,544,856 A  10/1985  King
(Continued)

FOREIGN PATENT DOCUMENTS

CA    2567523 A1   12/2005
DE    19732564 A1   2/1999
(Continued)

OTHER PUBLICATIONS

English translation of JP-2012044811-A (Year: 2012).*
(Continued)

*Primary Examiner* — Tulsidas C Patel
*Assistant Examiner* — Joshua Kiel M Rodriguez
(74) *Attorney, Agent, or Firm* — Seyfarth Shaw LLP

(57) ABSTRACT

A system (100), electromagnetic actuator (102) and track (101) for braking are provided. The actuator (102) includes pole portions (109) extending from back-iron portions. Respective longitudinal axes (104) of the pole portions (109) are arranged about parallel to one another and about perpendicular to a common movement axis (104). A pole pitch of the pole portions (109) is selected to induce eddy currents in a segmented track (101), such that the eddy currents are present in a skin depth at more than one surface of segments (105) of the segmented track (101) when the pole portions (Continued)

(109) are moving at given speeds. Eddy current generated losses occupy about an entirety of a volume of a segment (105) of the track (101) below a given intermediate speed, and the eddy current generated losses occupy at least one third of the volume of the segment (105) at a given maximum speed greater than the given intermediate speed. Individually controllable electrical windings are around respective pole portions (109).

19 Claims, 20 Drawing Sheets

Related U.S. Application Data filed on Nov. 7, 2019, provisional application No. 62/931,987, filed on Nov. 7, 2019, provisional application No. 62/932,113, filed on Nov. 7, 2019, provisional application No. 62/932,077, filed on Nov. 7, 2019, provisional application No. 62/932,013, filed on Nov. 7, 2019.

(51) Int. Cl.

| | | |
|---|---|---|
| *H01F 7/08* | (2006.01) | |
| *H01F 7/11* | (2006.01) | |
| *H01F 27/28* | (2006.01) | |
| *H02K 1/14* | (2006.01) | |
| *H02K 1/18* | (2006.01) | |
| *H02K 1/20* | (2006.01) | |
| *H02K 3/04* | (2006.01) | |
| *H02K 5/22* | (2006.01) | |
| *H02K 7/10* | (2006.01) | |
| *H02K 9/22* | (2006.01) | |
| *H02K 11/21* | (2016.01) | |
| *H02K 11/25* | (2016.01) | |
| *H02K 41/025* | (2006.01) | |
| *H02K 49/04* | (2006.01) | |
| *H05K 7/20* | (2006.01) | |

(52) U.S. Cl.
CPC ............... *H02K 1/14* (2013.01); *H02K 1/143* (2013.01); *H02K 1/18* (2013.01); *H02K 1/20* (2013.01); *H02K 3/04* (2013.01); *H02K 5/225* (2013.01); *H02K 9/227* (2021.01); *H02K 11/21* (2016.01); *H02K 11/25* (2016.01); *H02K 41/025* (2013.01); *H02K 41/031* (2013.01); *H02K 49/046* (2013.01); *H05K 7/20254* (2013.01); *H01F 2007/086* (2013.01); *H01F 7/11* (2013.01); *H02K 7/10* (2013.01); *H02K 2201/15* (2013.01); *H02K 2213/12* (2013.01)

(58) Field of Classification Search
CPC ........ H02K 5/225; H02K 9/227; H02K 11/21; H02K 11/25; H02K 41/025; H02K 41/031; H02K 49/046; H02K 7/10; H02K 2201/15; H02K 2213/12; H02K 3/18; H02K 3/40; H02K 3/52; H02K 11/40; H01F 7/064; H01F 7/081; H01F 27/28; H01F 7/11; H01F 2007/086; H05K 7/20254; Y02T 10/64; Y02T 10/72; B60L 13/03
See application file for complete search history.

(56) References Cited

U.S. PATENT DOCUMENTS

| | | |
|---|---|---|
| 4,689,529 A | 8/1987 | Higuichi |
| 4,788,477 A | 11/1988 | Teramachi et al. |
| 5,289,088 A | 2/1994 | Andoh |
| 5,868,077 A | 2/1999 | Kuznetsov |
| 6,522,035 B1 | 2/2003 | Smit |
| 6,741,010 B2 | 5/2004 | Wilkin |
| 2002/0053835 A1 | 5/2002 | Joong et al. |
| 2002/0081528 A1 | 6/2002 | Miyajima et al. |
| 2005/0029874 A1 | 2/2005 | Dadd |
| 2006/0131967 A1 | 6/2006 | Lin et al. |
| 2008/0143202 A1 | 6/2008 | Whitener et al. |
| 2008/0218005 A1* | 9/2008 | Tang .................... H02K 41/031 310/12.25 |
| 2012/0249991 A1 | 10/2012 | Hol et al. |
| 2013/0015725 A1 | 1/2013 | Trammell |
| 2013/0113320 A1 | 5/2013 | Calley et al. |
| 2015/0091393 A1 | 4/2015 | Hayner et al. |
| 2015/0171706 A1 | 6/2015 | Dadd |
| 2017/0346373 A1 | 11/2017 | Pabut et al. |
| 2018/0131258 A1 | 5/2018 | Dawidowicz |
| 2018/0166953 A1 | 6/2018 | Han |

FOREIGN PATENT DOCUMENTS

| | | | |
|---|---|---|---|
| DE | 102006027819 A1 | 12/2007 | |
| EP | 0093547 A1 | 11/1983 | |
| EP | 1213819 A2 | 6/2002 | |
| EP | 1511164 A2 | 3/2005 | |
| EP | 1544980 A1 | 6/2005 | |
| EP | 2876783 A1 | 5/2015 | |
| EP | 3107195 A1 | 12/2016 | |
| EP | 3258131 A1 | 12/2017 | |
| FR | 1165541 A1 | 10/1958 | |
| FR | 2526570 A1 | 11/1983 | |
| JP | 8586055 A | 1/1983 | |
| JP | 85886859 A | 5/1983 | |
| JP | 86098864 A | 6/1985 | |
| JP | 2012044811 A | * | 3/2012 |
| WO | 03105317 A1 | 12/2003 | |
| WO | 2008142001 A2 | 11/2008 | |

OTHER PUBLICATIONS

"International Search Report" mailed Mar. 1, 2021, issued in corresponding PCT Application No. PCT/US2020/059010, Filed Nov. 5, 2020.
"International Search Report" mailed Feb. 15, 2021, issued in corresponding PCT Application No. PCT/US2020/059012, Filed Nov. 5, 2020.
Molnar, Sabinus, "International Search Report" mailed Feb. 23, 2021, issued in corresponding PCT Application No. PCT/US2020/059017, Filed Nov. 5, 2020.
Molnar, Sabinus, "International Search Report" mailed Feb. 24, 2021, issued in corresponding PCT Application No. PCT/US2020/059023, Filed Nov. 5, 2020.
Contreras, Sampayo, J., "International Search Report" mailed Apr. 15, 2021, issued in corresponding PCT Application No. PCT/US2020/059028, Filed Nov. 5, 2020.
Kovacsovics, Martin, "International Search Report", mailed Mar. 1, 2021, issued in corresponding PCT Application No. PCT/US2020/059036, Filed Nov. 5, 2020.

* cited by examiner

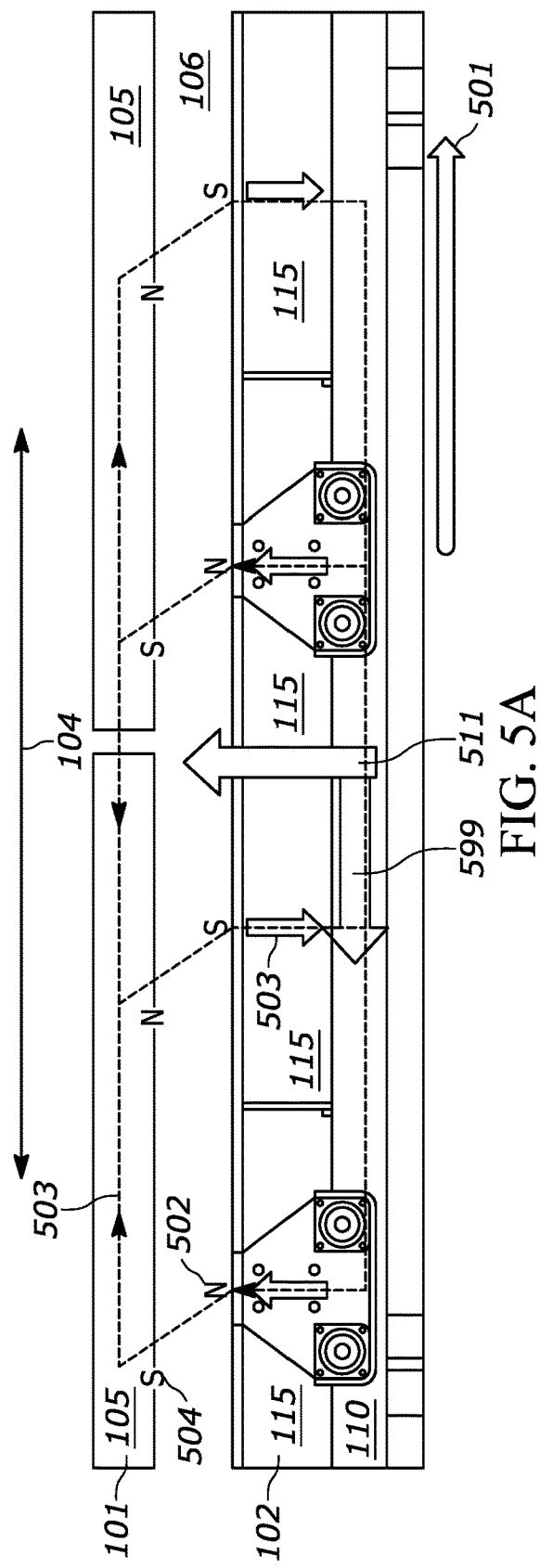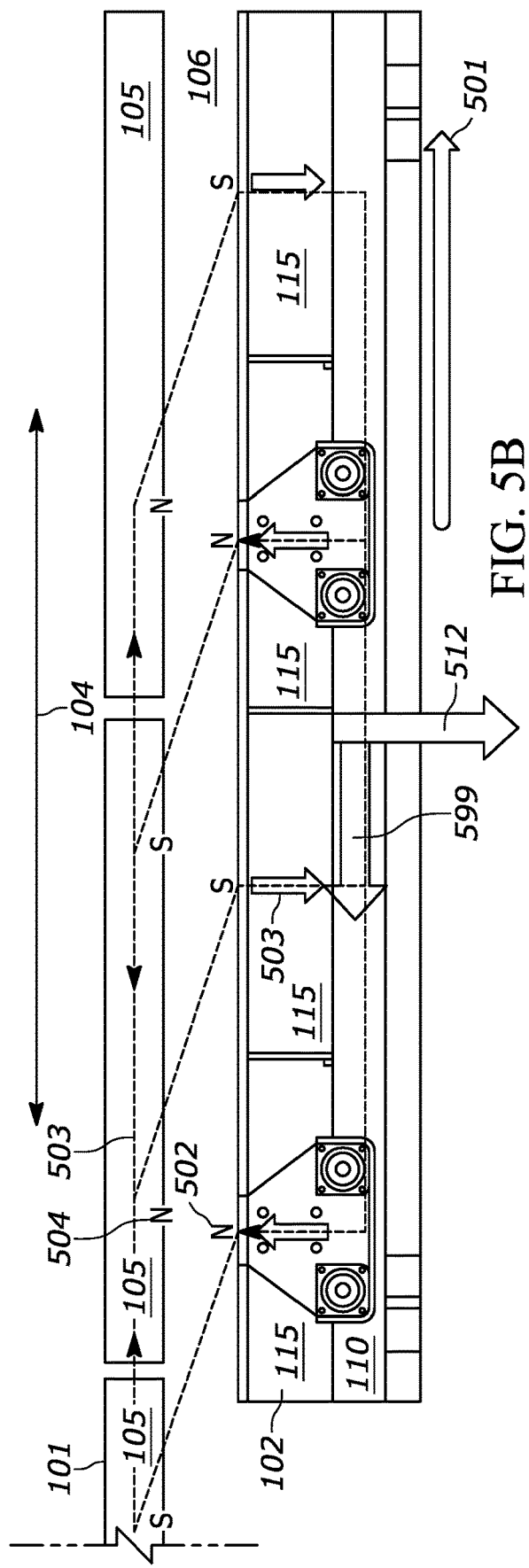

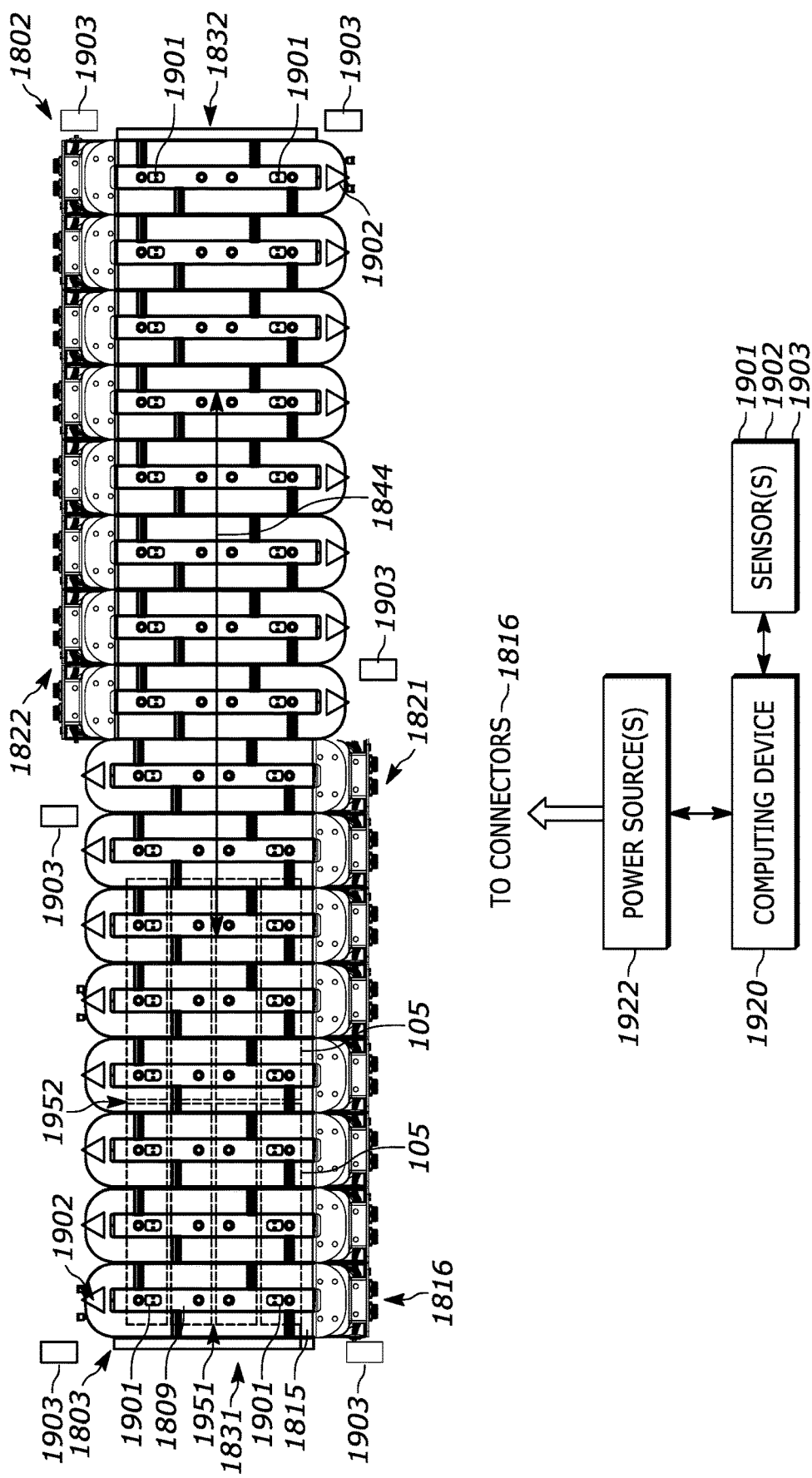

SYSTEM, ELECTROMAGNETIC ACTUATOR AND TRACK FOR BRAKING

CROSS-REFERENCE TO RELATED APPLICATIONS

This application claims priority from U.S. Provisional Patent Application having Ser. No. 62/945,978, filed on Dec. 10, 2019, the entire contents of which is incorporated herein by reference; this application further claims priority from US Provisional Patent Applications having Ser. Nos. 62/931,935, 62/931,987, 62/932,013, 62/932,077, 62/932,113, all of which were filed on Nov. 7, 2019, and the entire contents of which are incorporated herein by reference.

BACKGROUND

The constraints of a transportation system that seeks to promote high speed, high efficiency, and high power density, impose challenges that are not present in the state of the art. In particular, such a transportation system may use eddy current brakes, however braking functions in a high speed transportation system may require higher braking forces and hence may induce heat in a problematic manner.

BRIEF DESCRIPTIONS OF THE DRAWINGS

For a better understanding of the various examples described herein and to show more clearly how they may be carried into effect, reference will now be made, by way of example only, to the accompanying drawings in which:

FIG. 5A and FIG. 5B depict a portion of the track and the electromagnetic actuator of the system of FIG. 1 in operation with each other as the electromagnetic actuator 102 moves at different speeds, according to non-limiting examples.

Figure 6A:
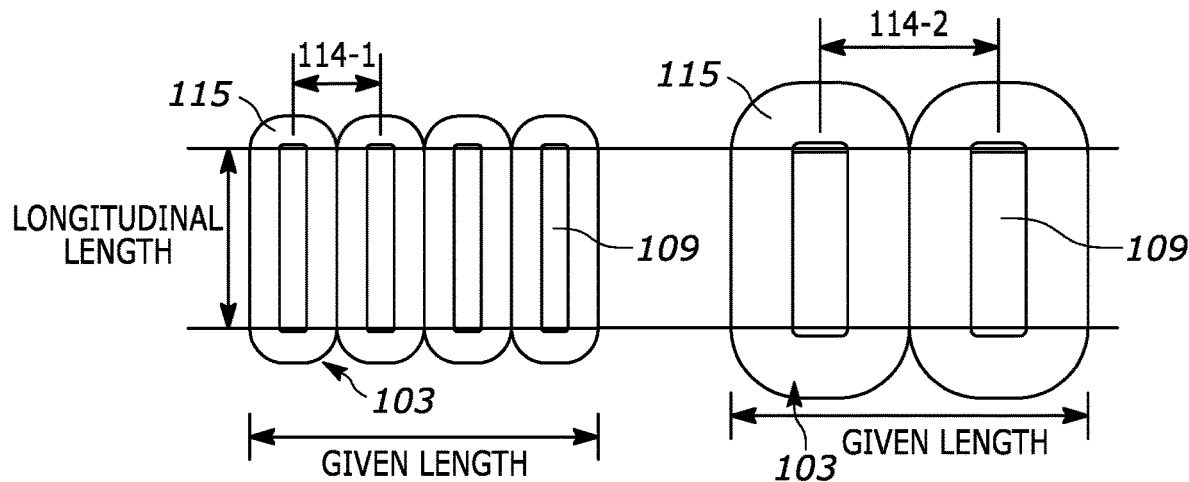
FIG. 6A depicts examples of pole portions and electrical windings at two different pole pitches, according to non-limiting examples.
Figure 6B:
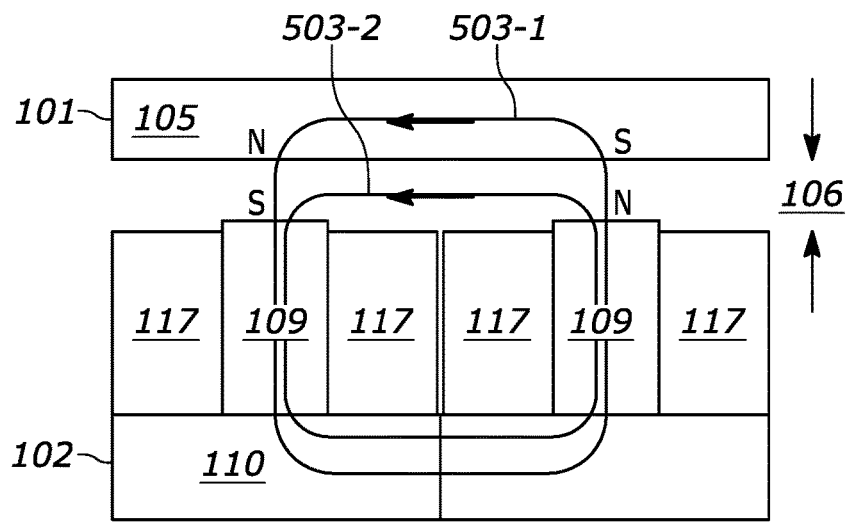

FIG. 6B schematically depicts flux paths for a smaller pole pitch, according to non-limiting examples.

Figure 6C:
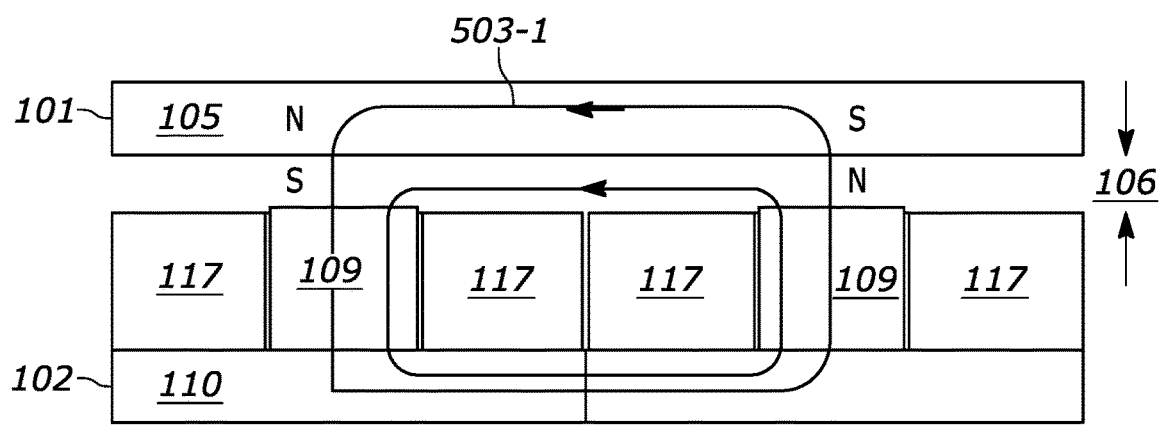

FIG. 6C schematically depicts flux paths for a larger pole pitch, according to non-limiting examples.

Figure 1:
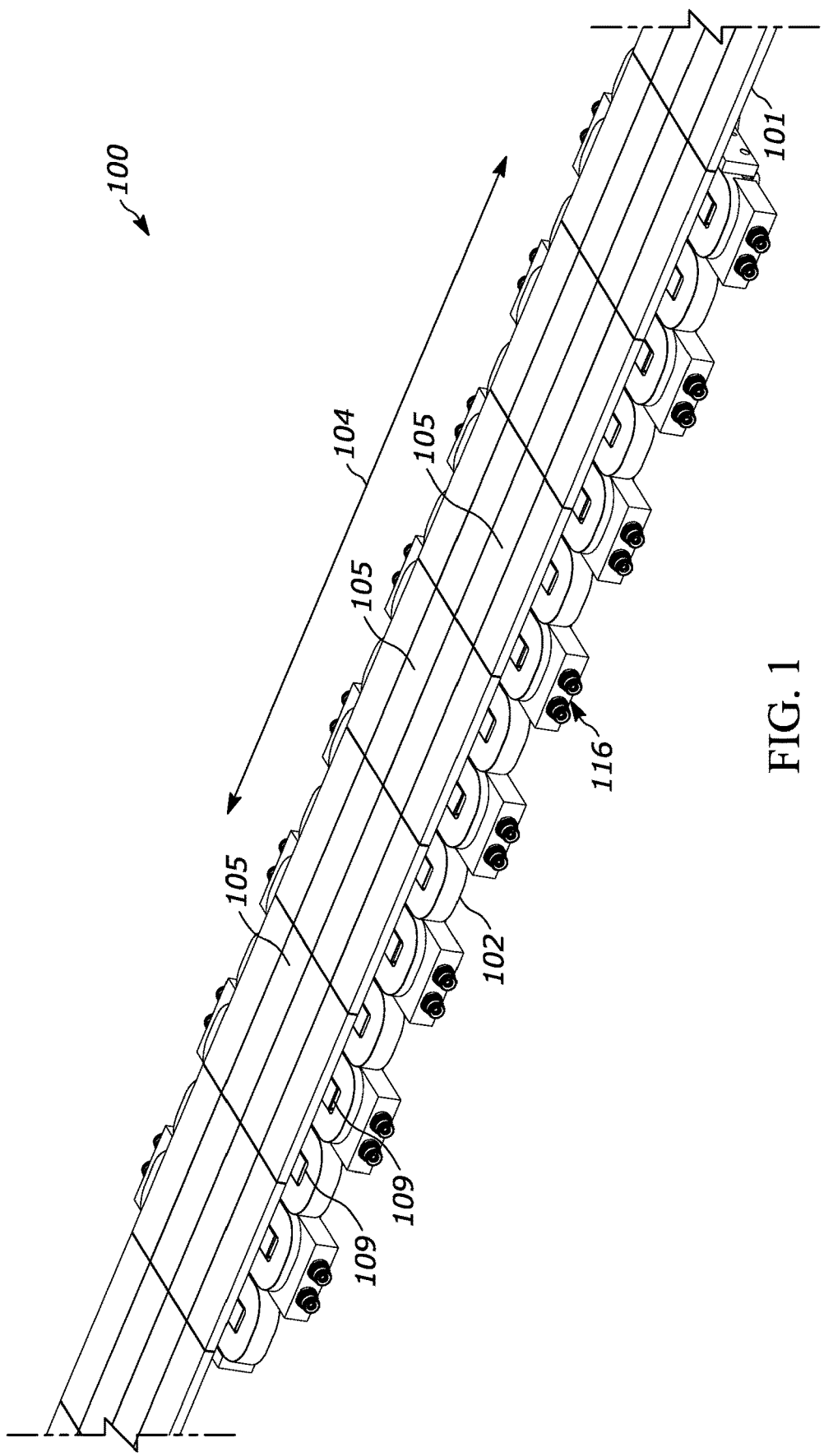
FIG. 1 depicts a perspective view of a system for braking, according to non-limiting examples.
Figure 7A:
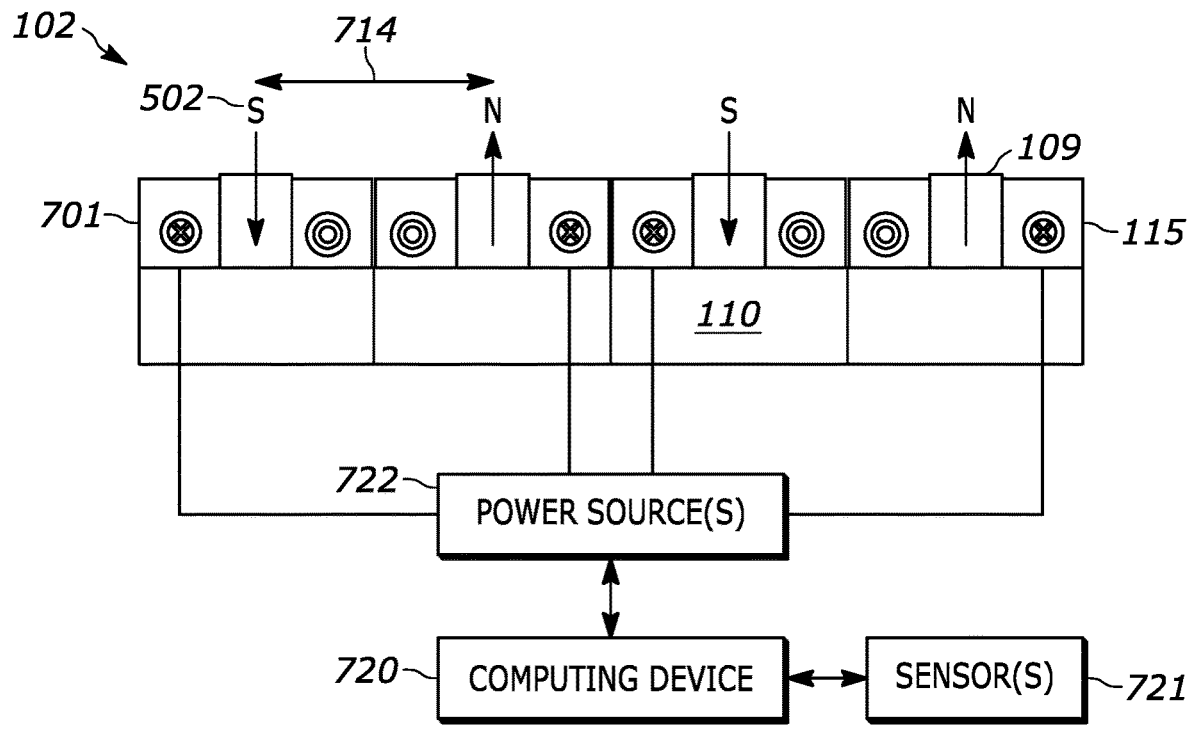
Figure 7B:
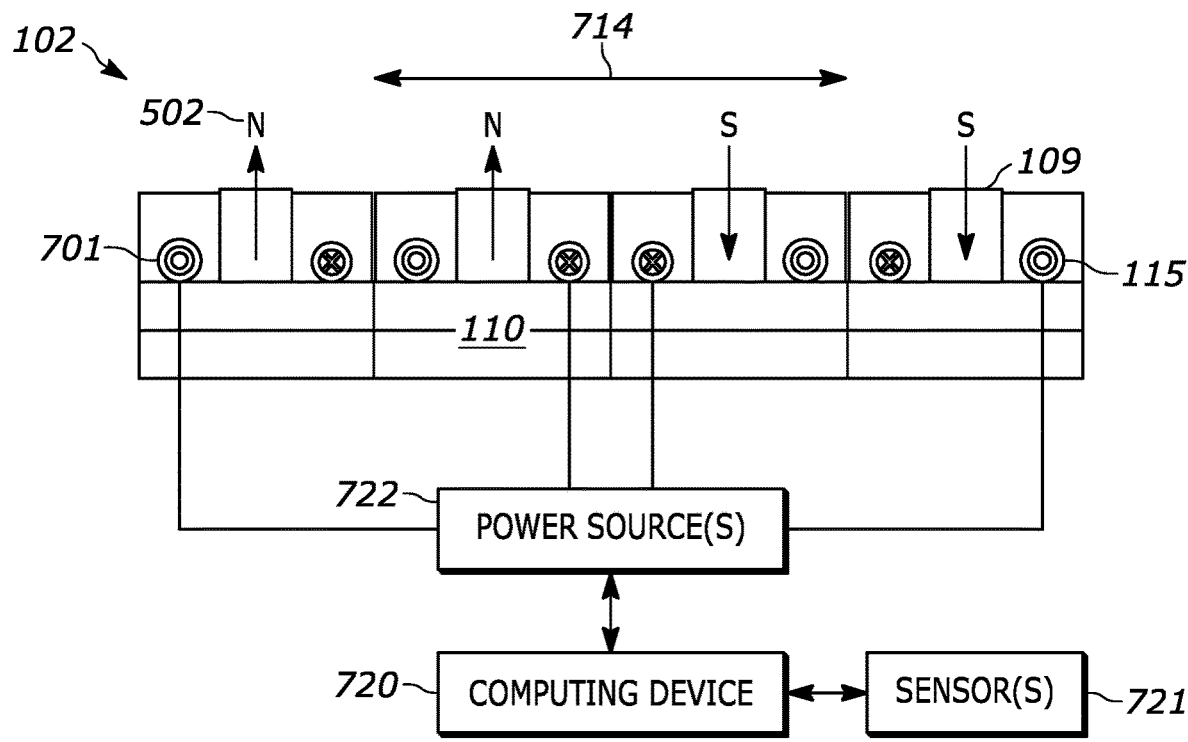

FIG. 7A and FIG. 7B schematically depict a portion of the electromagnetic actuator of the system of FIG. 1 in two different magnetic pole pitch modes, according to non-limiting examples.

Figure 8:
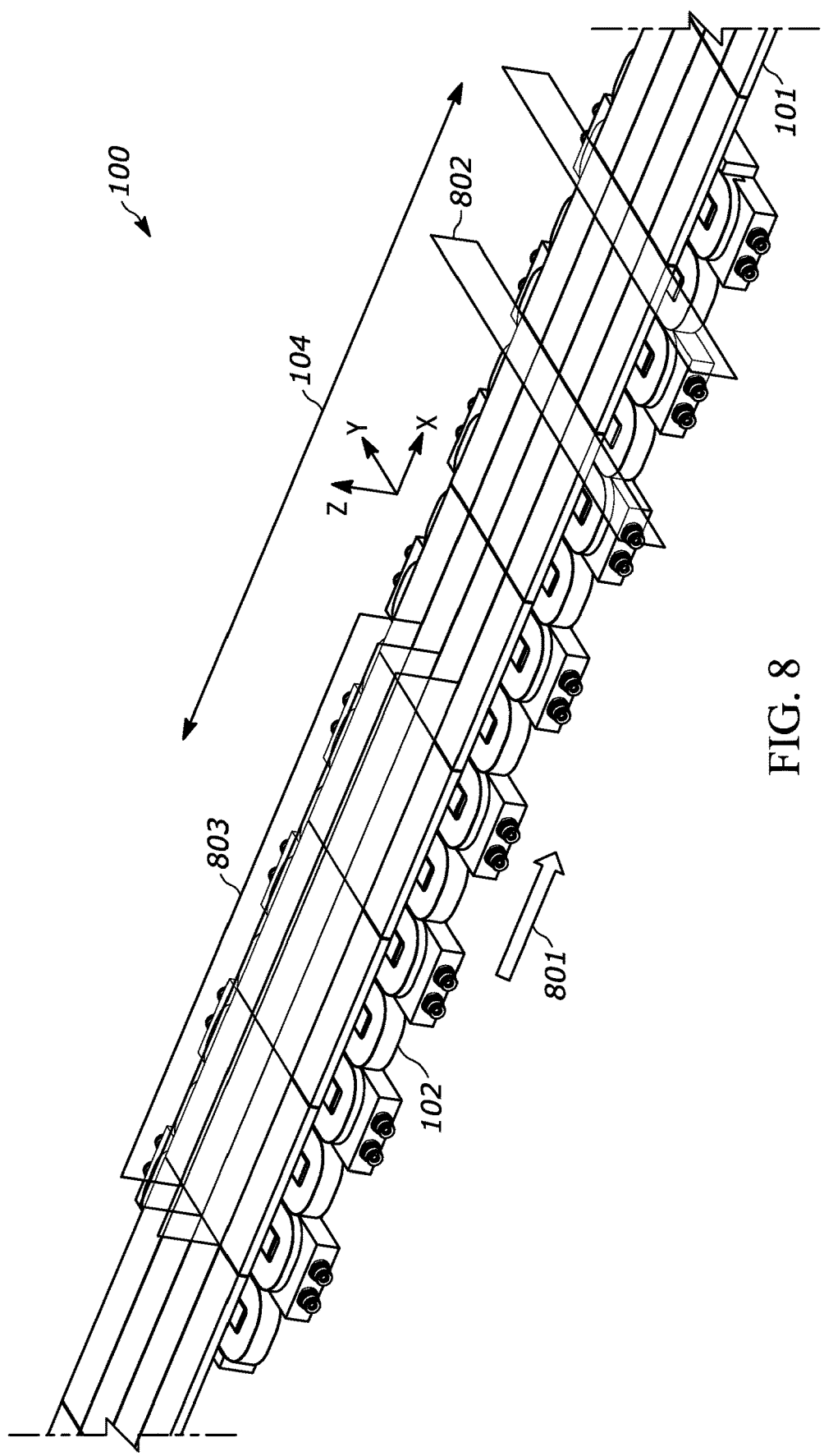

FIG. 8 depicts planes of segmentation of the track of the system of FIG. 1, according to non-limiting examples.

FIG. 9A, FIG. 9B, FIG. 9C and FIG. 9D, which depict portions of the system of FIG. 1 with different segmentations of the track, according to non-limiting examples.

Figure 10A:
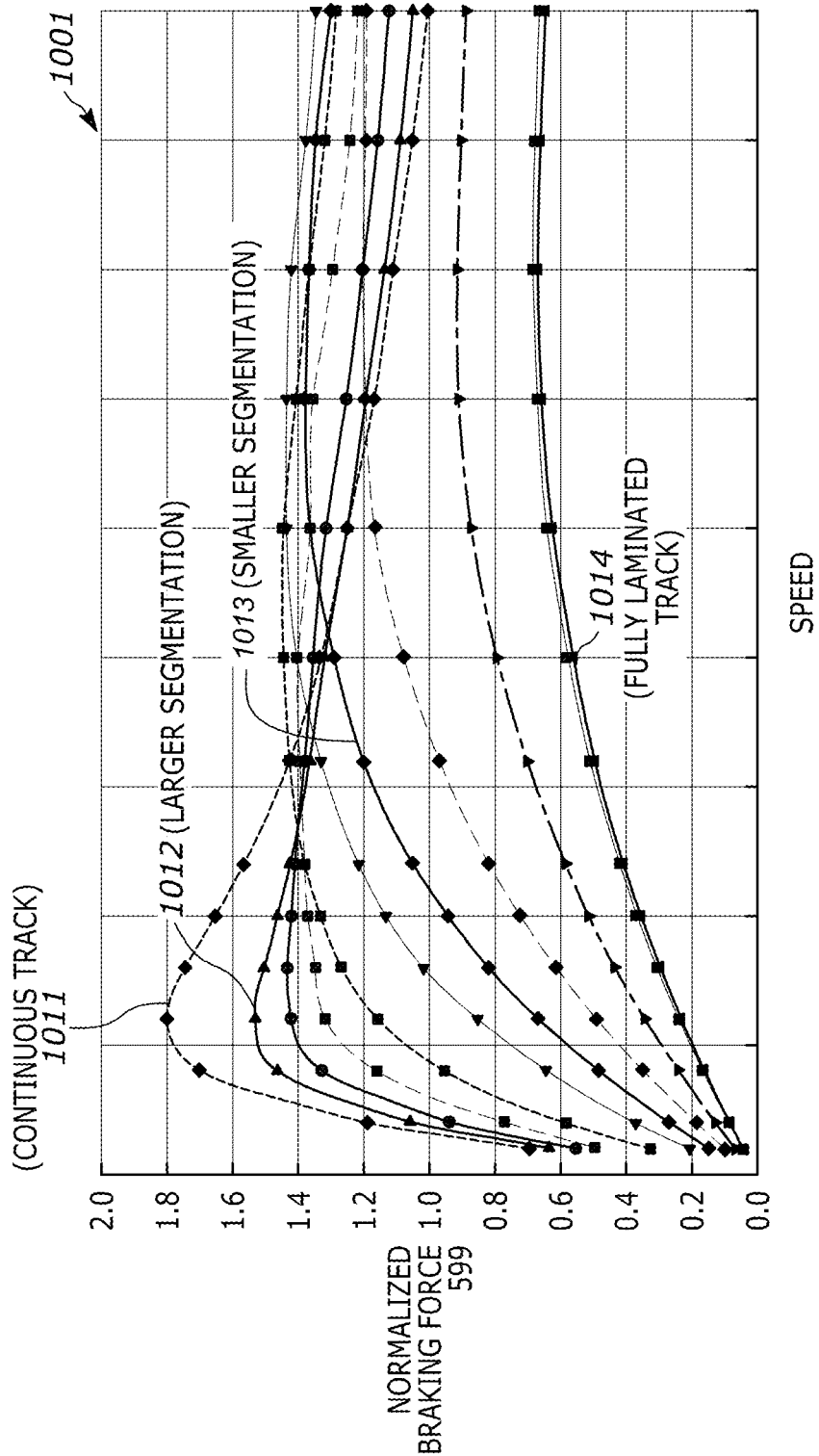
Figure 10B:
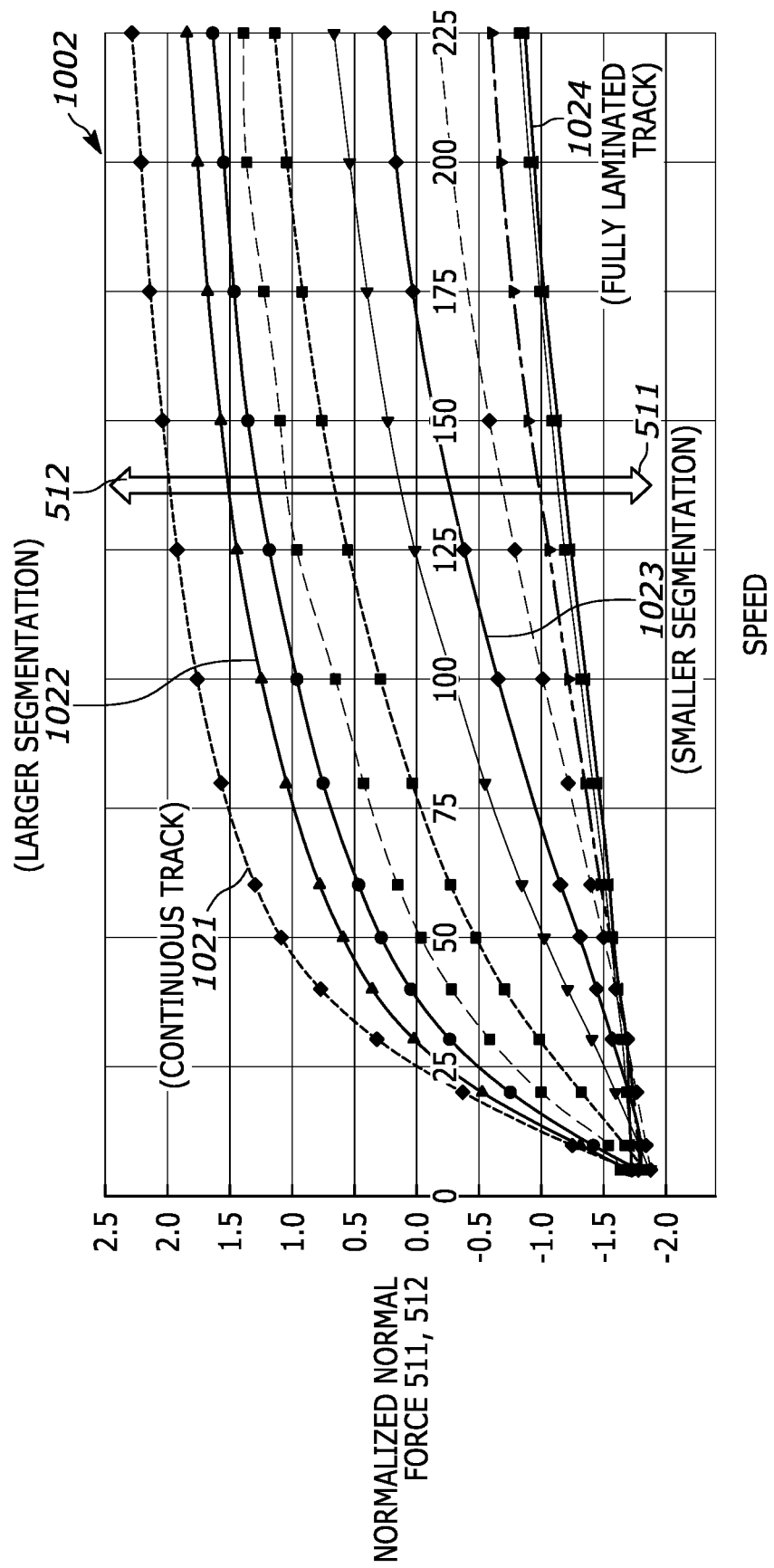

FIG. 10A and FIG. 10B respectively depict graphs of braking force as a function of speed for different track segmentations, and normal force as a function of speed for different track segmentations, according to non-limiting examples.

Figure 11A:
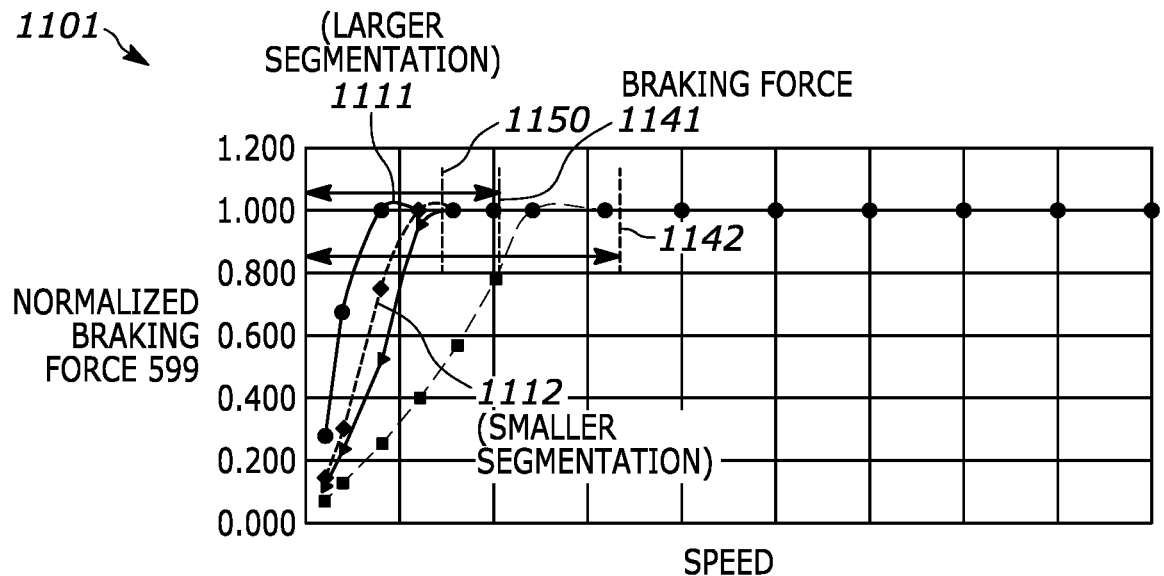
Figure 11B:
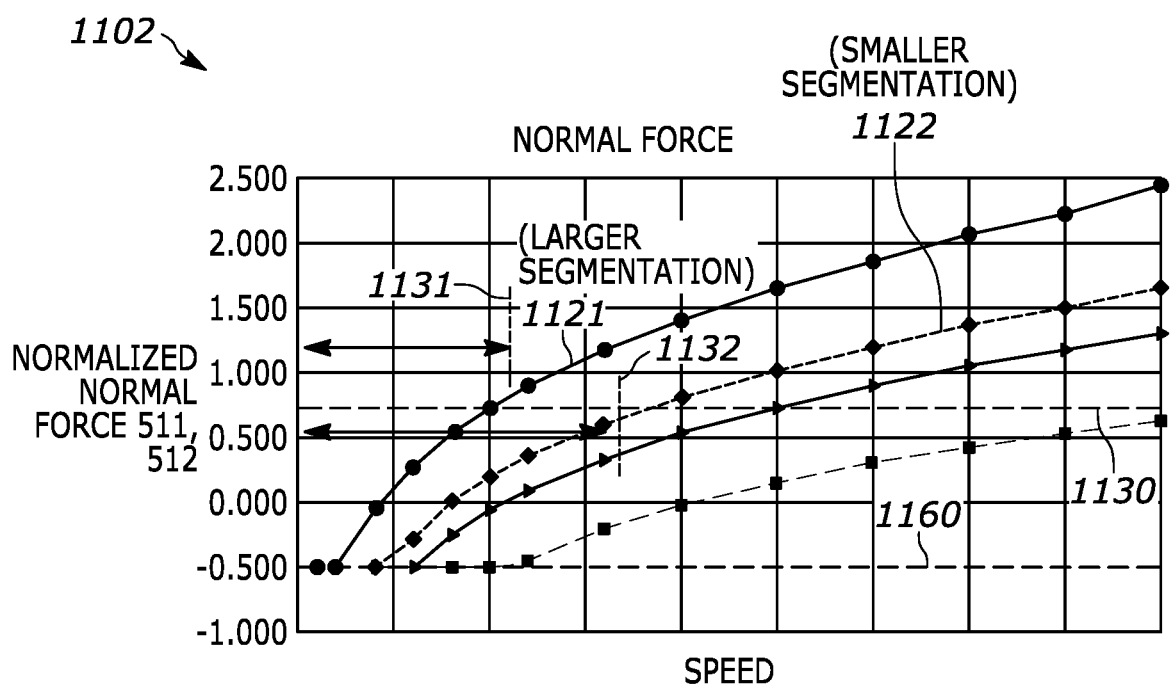

FIG. 11A and FIG. 11B respectively depict graphs of braking force as a function of speed for different track segmentations, and normal force as a function of speed for different track segmentations, according to non-limiting examples.

Figure 12:
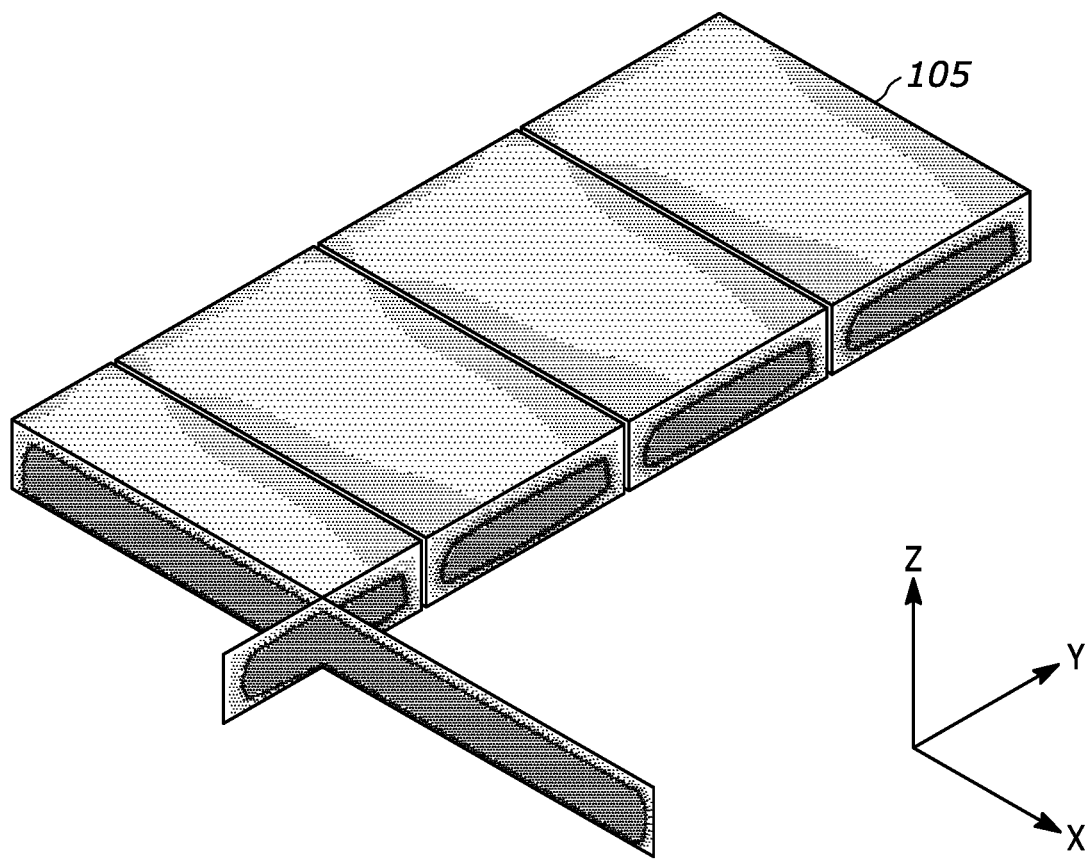

FIG. 12 depicts cross-sections of segments of the track of the system of FIG. 1, showing average eddy current distribution in the segments at a given speed, according to non-limiting examples.

Figure 13A:
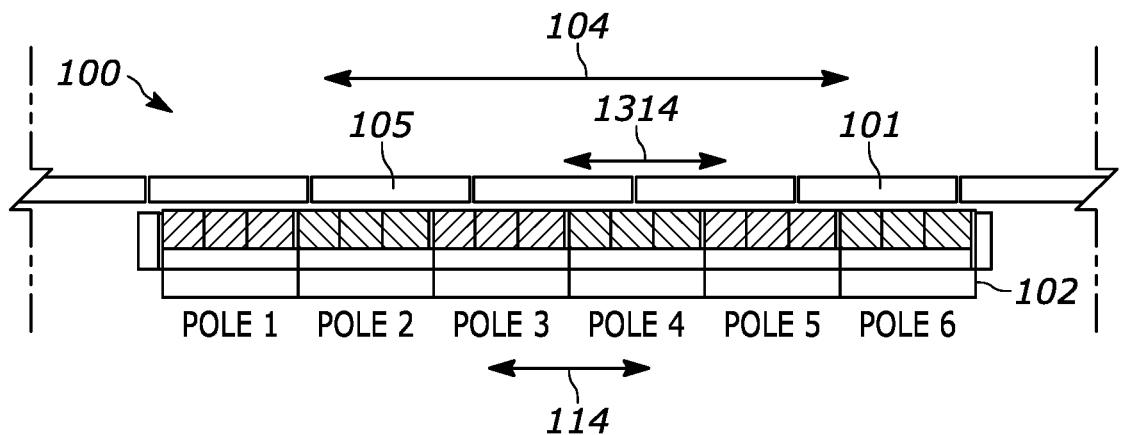

FIG. 13A depicts six example poles (e.g., pole portions and/or magnetic poles) with an example pole pitch and an example track segment pitch, according to non-limiting examples.

Figure 13B:
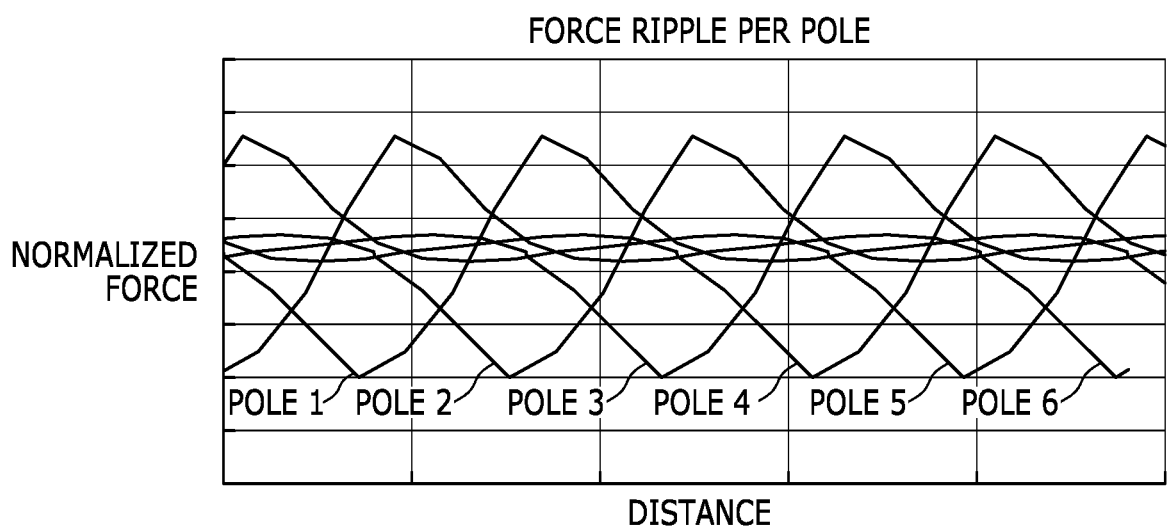

FIG. 13B depicts a graph of normalized braking force for each of the six pole portions of the example of FIG. 13A, at a given position relative to the track, according to non-limiting examples.

Figure 13C:
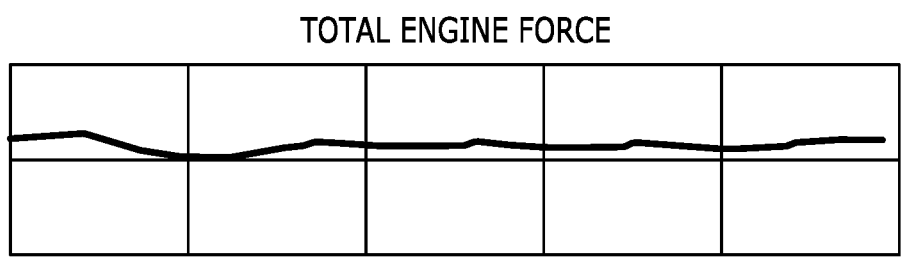

FIG. 13C depicts a sum of the normalized braking forces of the graph of FIG. 13A, according to non-limiting examples.

Figure 14:
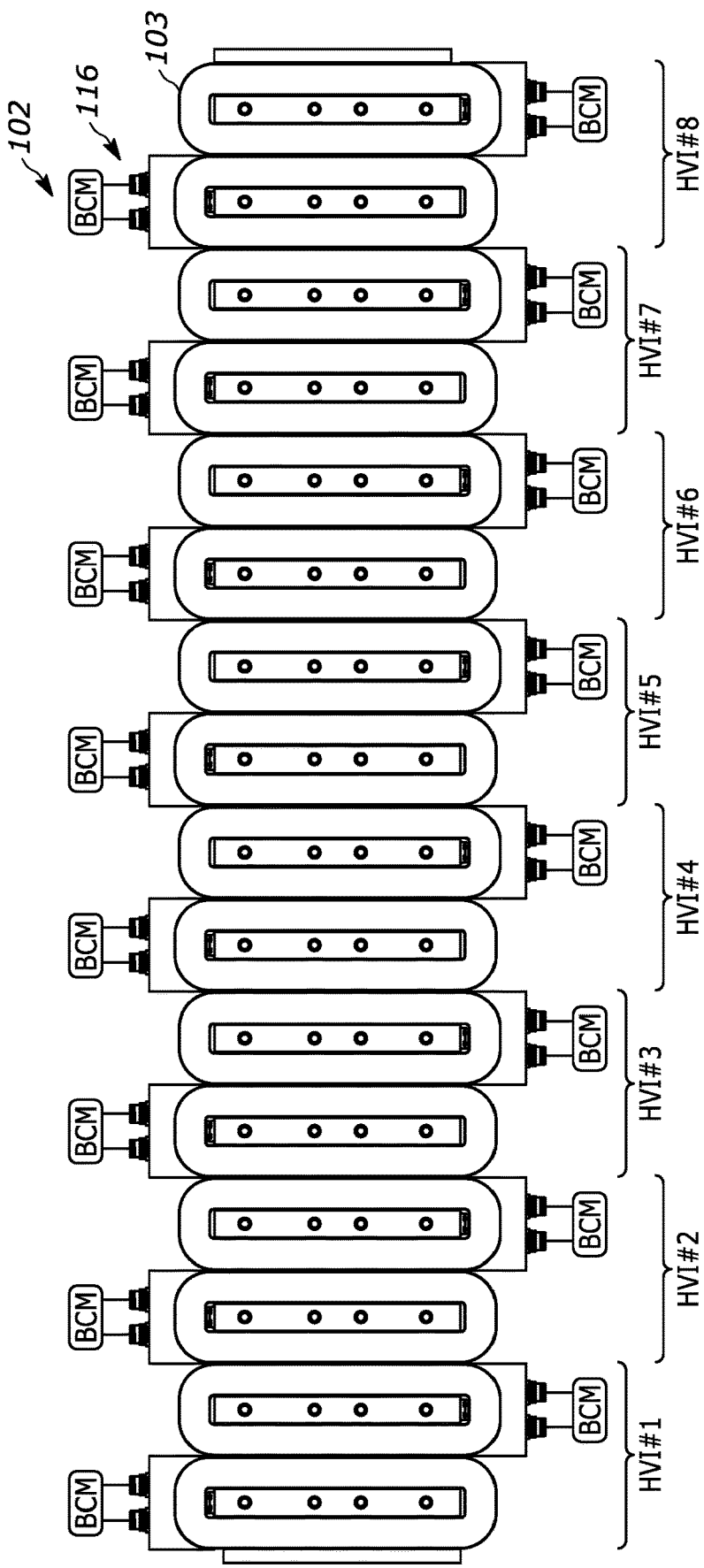

FIG. 14 depicts electrical connections to the electromagnetic actuator of the system of FIG. 1, according to non-limiting examples.

Figure 15A:
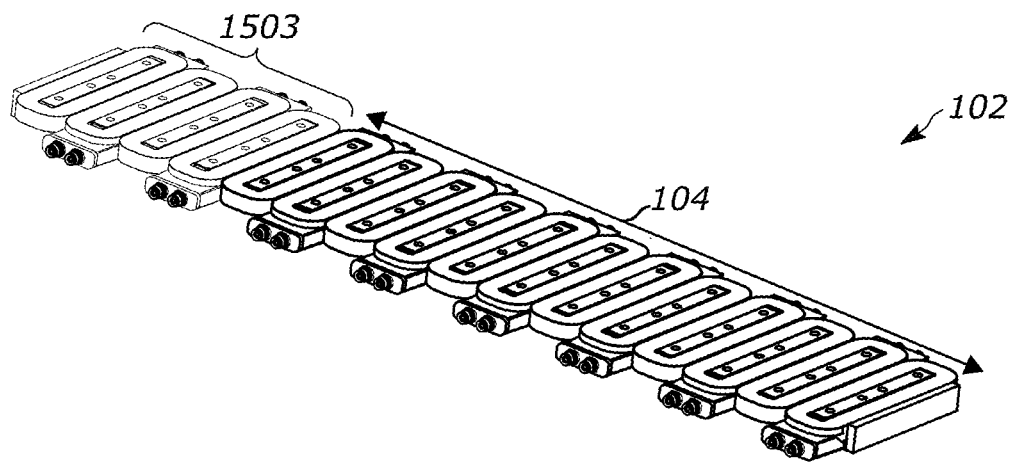
Figure 15B:
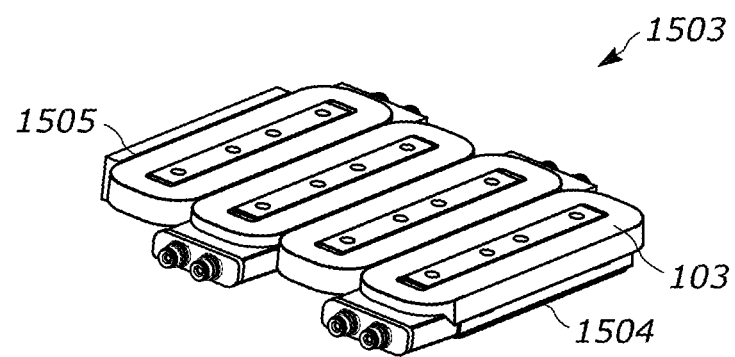

FIG. 15A and FIG. 15B respectively depict a perspective view of the electromagnetic actuator of the system of FIG. 1, and a perspective view of a module thereof, according to non-limiting examples.

Figure 16A:
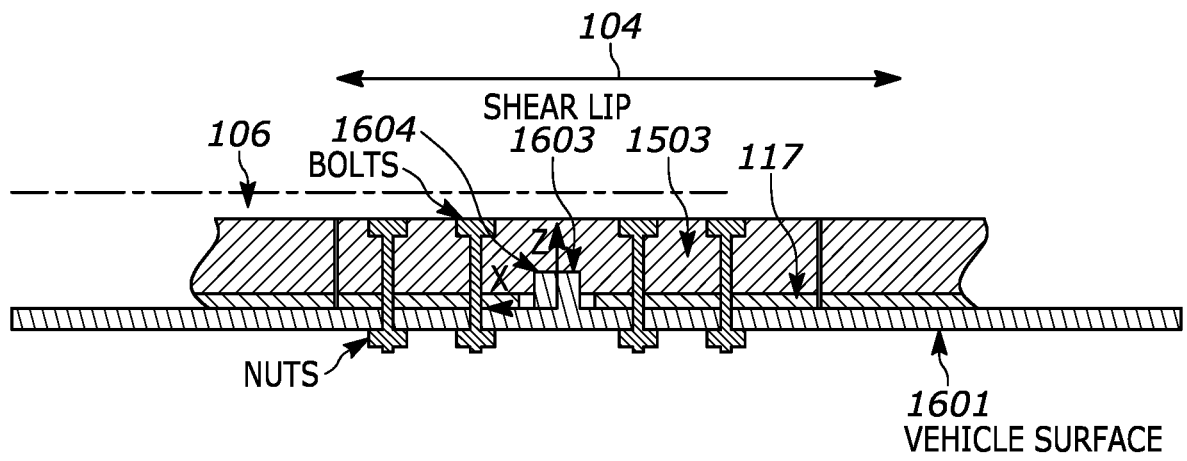
Figure 16B:
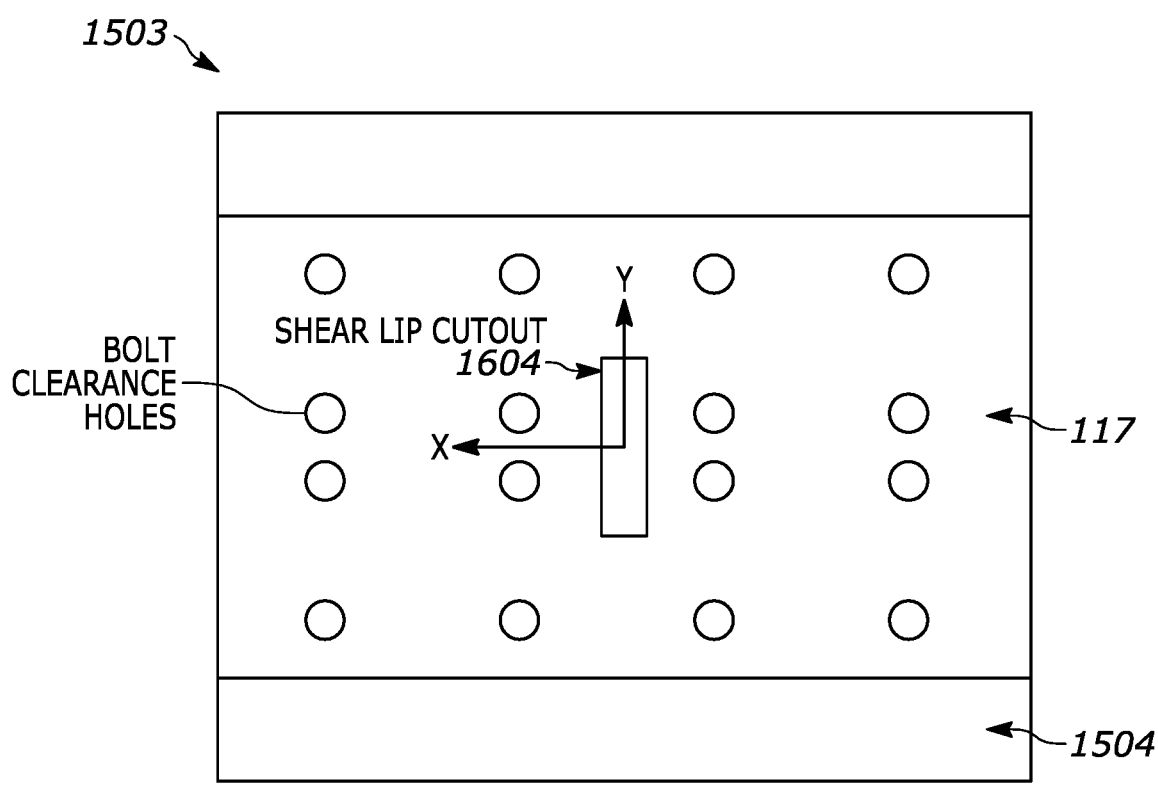

FIG. 16A and FIG. 16B respectively and schematically depict a module attached to a vehicle, and a vehicle facing side of a module, according to non-limiting examples.

Figure 17:
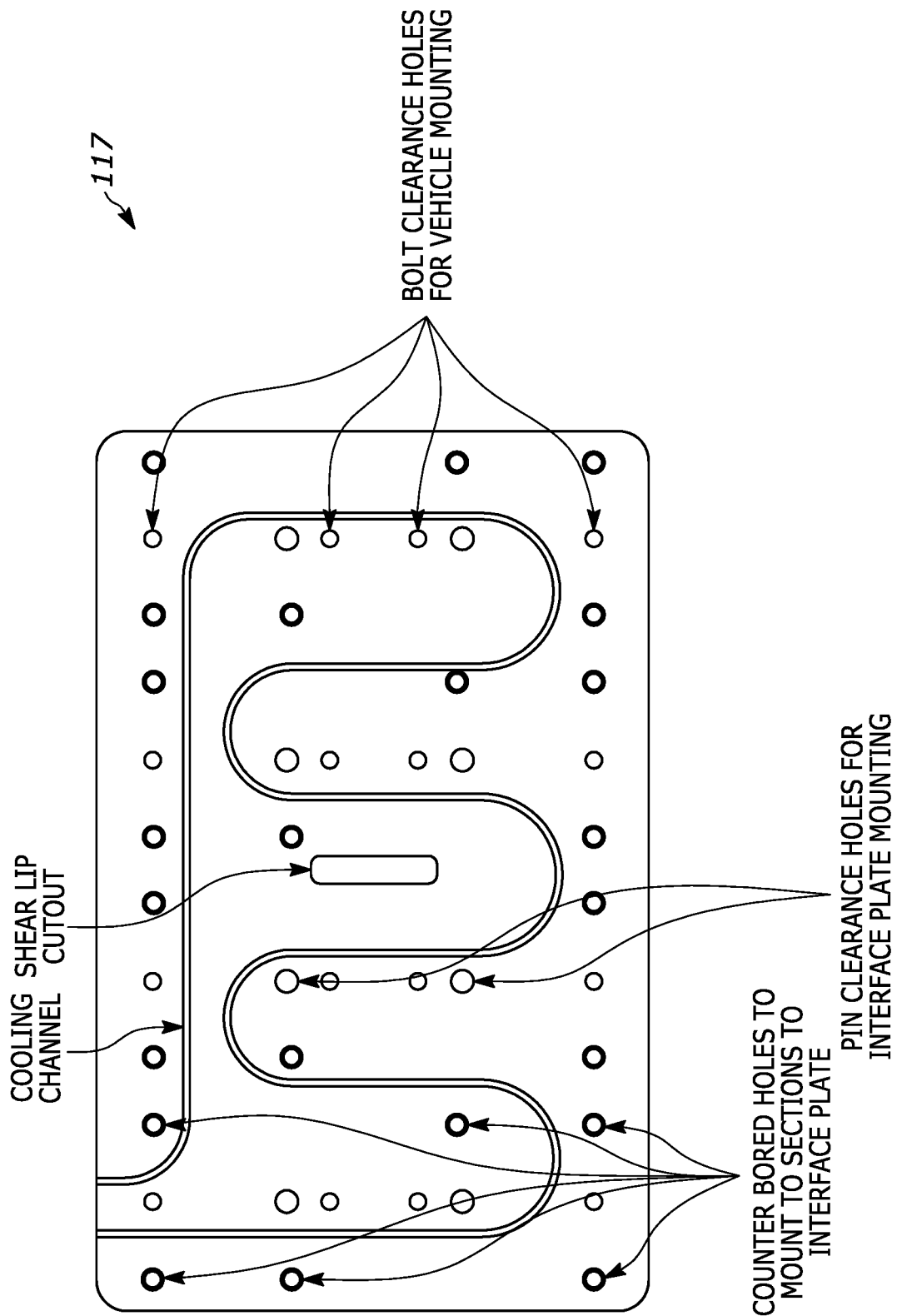

FIG. 17 depicts an example cold plate for use with the electromagnetic actuator of the system of FIG. 1, according to non-limiting examples.

Figure 18:
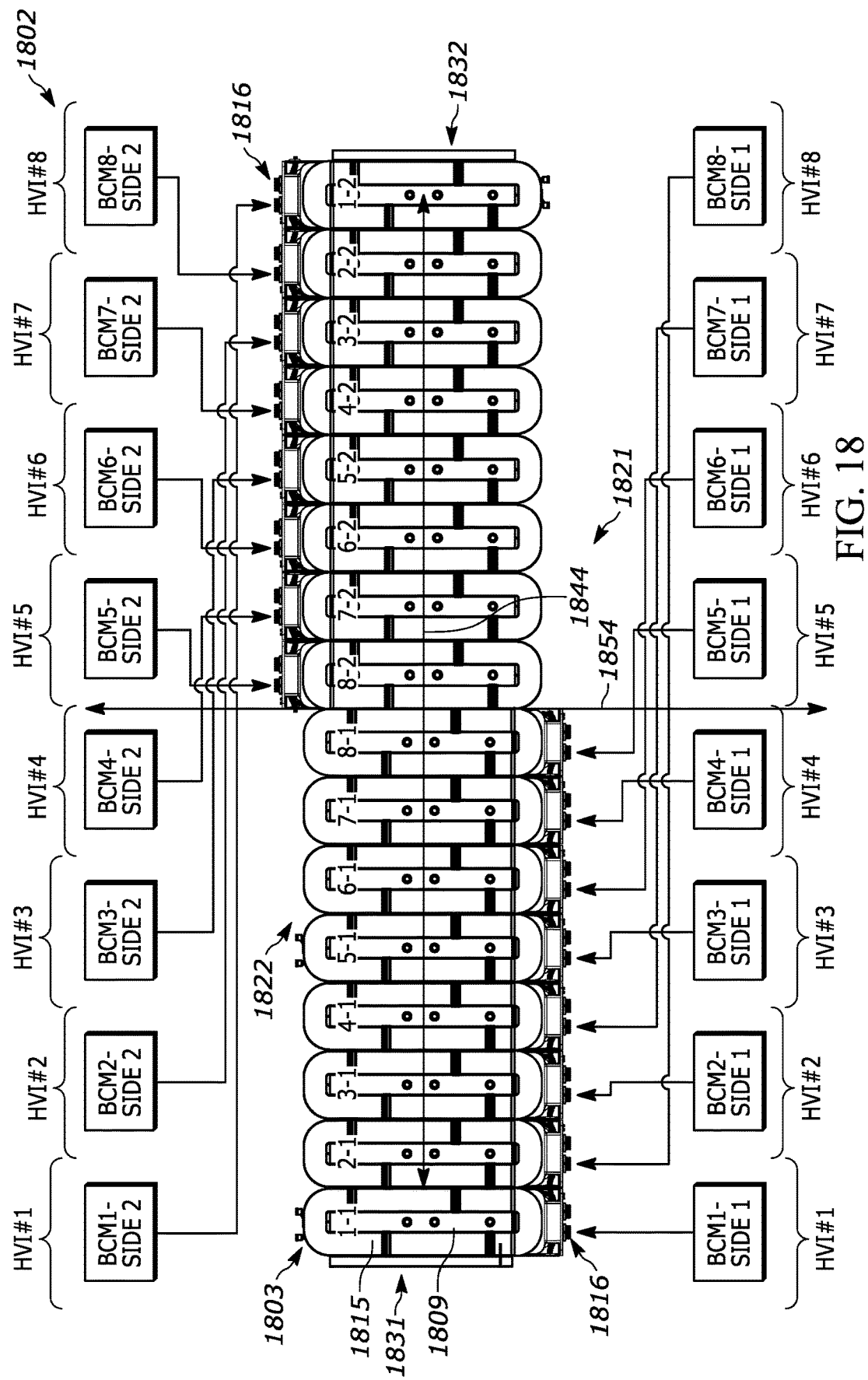

FIG. 18 depicts electrical connections to an alternative electromagnetic actuator, according to non-limiting examples.

FIG. 19 depicts sensors of the electromagnetic actuator of FIG. 18, according to non-limiting examples

DETAILED DESCRIPTION

The constraints of a transportation system that seeks to promote high speed, high efficiency, high power density, and high passenger throughput, impose challenges that are not present in the state of the art. In particular, such a transportation system may use electromagnetic eddy current brakes, as provided herein, to decelerate the vehicle at a much higher rate than state-of-the-art brakes and stop the vehicle in the shortest possible distance. This capability may enable small headways between vehicles and/or increase passenger throughput. However, achieving such performance for braking in a high-speed transportation system may require higher braking forces and hence may induce heat, especially in the track, in a problematic manner; the system for braking as provided herein may address such issues.

Hence, provided herein is a system for braking (e.g., a braking system) that includes a track and an electromagnetic actuator, that may be attached to a pod and/or a vehicle. The electromagnetic actuator is controlled to induce eddy current in the track to slow down the vehicle as fast as possible during an emergency situation. The electromagnetic actuator includes electrical windings (e.g., that include conductor coils and electrical insulation) and pole portions extending from one or more back-iron portions (e.g., the pole portions and back-iron portions comprising a ferromagnetic material, such as ferromagnetic steel) that are controlled to form at least one pair of alternating magnetic poles (e.g., alternating north and south magnetic poles), which travels with the vehicle. Braking force can be controlled by changing excitation current in the electrical windings (e.g., the conductor coils), which control magnetic flux in the pole portions and induce eddy currents in the track, which cause the braking force.

Throughout the present specification, reference will be made to the skin depth of eddy currents in a track, and in particular track segments; skin depth may be defined as a depth where an eddy current density decays to about 36.8% of its value at a surface of a body of conductive material at which the eddy currents are generated (e.g., a body of a track and/or track segments thereof). Skin depth confinement of eddy current is generally a result of the skin effect, which describes the tendency of an alternating electric current to become distributed within a conductive material such that the current density is largest near a surface of the conductive material and decreases with greater depths inside the conductive material. Skin depth generally depends on a frequency of the alternating electric current and the electrical and magnetic properties of the conductive material.

The system for braking provided herein generally converts kinetic energy (e.g., of the vehicle) into electromagnetic iron loss in the track, generally via induced eddy currents, which creates eddy current loss. The conversion is through contactless magnetic energy transfer across an air gap between the electromagnetic actuator and the track.

The track (which may also be referred to as a rail) generally comprises segments of solid (e.g., unlaminated) ferromagnetic material (e.g., ferromagnetic steel), which reacts to the traveling alternating magnetic fields produced by the electromagnetic actuator, in the form of induced eddy currents in a surface skin depth of the track. Skin depth of the eddy current induced by an electromagnetic actuator generally changes with respect to the speed of the electromagnetic actuator and/or the vehicle (e.g., higher speeds result in smaller skin depth, lower speeds result in larger skin depth); skin depth also generally changes with respect to actuator pole pitch (e.g., smaller actuator pole pitches result in smaller skin depth, and larger actuator pole pitches result in larger skin depth).

Eddy currents in the track generate heat that is generally isolated in the skin depth. As a result, there may be a high thermal gradient between a surface and center (e.g., interior) of the track, which may lead to high mechanical stress on the surface and in the body of the track, as the surface stresses could cause a bending moment on the track that can impose mechanical stresses all over the track. The increase of track temperature also generally adversely affects the yield strength of the material of the track segments. The stress imposed by heat could potentially exceed the allowable strength of the track material and result in permanent deformation. Hence, limiting and/or minimizing track temperature differentials between track surface and center and/or minimizing the overall temperature rise may be important to maintaining safe operation of the braking system. Also, enabling the track to freely expand and deflect under thermal loads may reduce induced stress in the track. Since the thermal stresses are caused by deformation, avoiding the use of a fixed supports (e.g., of a support structure) in certain regions may help to diminish the magnitude of the stress distribution on the track. However, it may be important to position the fixed supports of the support structure to optimize the deflections and stresses in the track.

Regardless, applying as high a braking force as possible is desirable to stop the vehicle in as short a distance as possible. Put another way, minimizing a braking distance, and/or a distance from a travelling speed to full stop, is generally desirable. For example, in a high-speed transportation system where a plurality of vehicles are being propelled, for example in a tube, when one stops, for example to an emergency situation, the other vehicles following the stopped vehicle should be stopped in as short a distance as possible and/or as fast as possible, for example to prevent collisions between the vehicles. Hence, for safety reasons, the vehicles are generally controlled such that distances therebetween are at least equal to (or greater than) the braking distance. Hence, minimizing the braking distance may also lead to increasing throughput of vehicles in the transportation system, as the distance therebetween may be shortened as the braking distance is reduced and/or a braking force is increased.

However, as mentioned above, operating the electromagnetic actuator in a manner that results in a higher braking force may lead to a higher track temperature rise as more energy is dissipated into the track.

Indeed, such a problem is generally particular to high-speed transportation systems where "low" speeds may be higher than 180 km/hr (e.g., 50 m/s) and/or "high" speeds may be greater than 600 to 700 km/hr. Hence, vehicles of lower-speed transportation systems (e.g., including conventional trains) may not suffer from the challenges of high-speed transportation systems.

Hence, an aspect of the present specification provides an electromagnetic actuator for braking, the electromagnetic actuator comprising: pole portions extending from one or more back-iron portions, respective longitudinal axes of the pole portions arranged about parallel to one another and about perpendicular to a common movement axis, wherein a pole pitch of the pole portions is selected: to induce eddy currents in an associated segmented track, such that the eddy currents are present in a skin depth at more than one surface of segments of the associated segmented track when the pole portions are moving at given speeds; and such that eddy current generated losses occupy about an entirety of a volume of a segment below a given intermediate speed, and the eddy current generated losses occupy at least one third of the volume of the segment at a given maximum speed greater than the given intermediate speed, and electrical windings, wherein an electrical winding is around a respective pole portion, the electrical windings being individually controllable.

Another aspect of the present specification provides a track for an electromagnetic actuator, the track comprising: segments arranged along a movement axis, each of the segments comprising a solid ferromagnetic material electrically insulated from one another; and mounting devices for mounting the segments to a fixed surface.

Another aspect of the present specification provides a system for braking comprising: a track; and an electromagnetic actuator for braking, the electromagnetic actuator arranged such that the electromagnetic actuator moves along a movement axis of the track, with a gap therebetween, the track comprising: segments arranged along the movement axis, each of the segments comprising a solid ferromagnetic material, the electromagnetic actuator comprising: pole portions extending from one or more back-iron portions, respective longitudinal axes of the pole portions arranged about parallel to one another and about perpendicular to a common movement axis, wherein a pole pitch of the pole portions is selected: to induce eddy currents in the segments of the track, such that the eddy currents are present in a skin depth at more than one surface of the segments of the track when the pole portions are moving at given speeds; and such that eddy current generated losses occupy about an entirety of a volume of a segment below a given intermediate speed, and the eddy current generated losses occupy at least one third of the volume of the segment at a given maximum speed greater than the given intermediate speed, and electrical windings, wherein an electrical winding is around a respective pole portion, the electrical windings being individually controllable.

Attention is next directed to FIG. 1, FIG. 2, FIG. 3 and FIG. 4.

Figure 2:
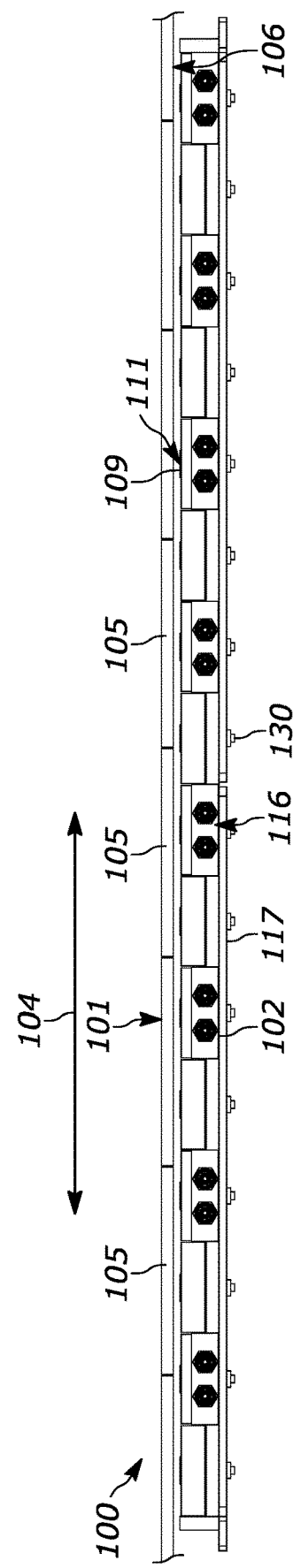
FIG. 2 depicts a side view of the system of FIG. 1, according to non-limiting examples.
Figure 3:
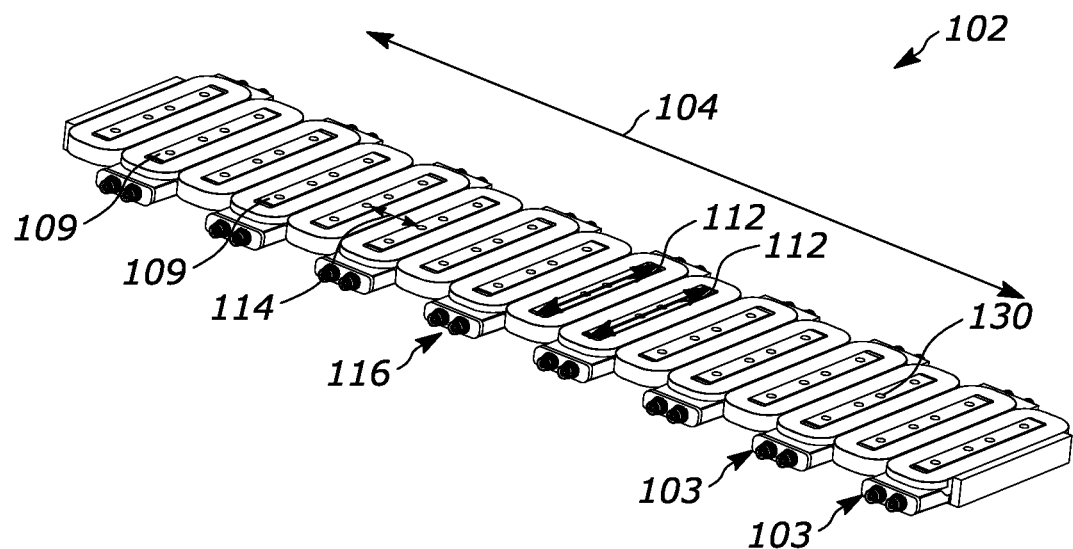
FIG. 3 depicts a perspective view of an electromagnetic actuator of the system of FIG. 1, according to non-limiting examples.
Figure 4:
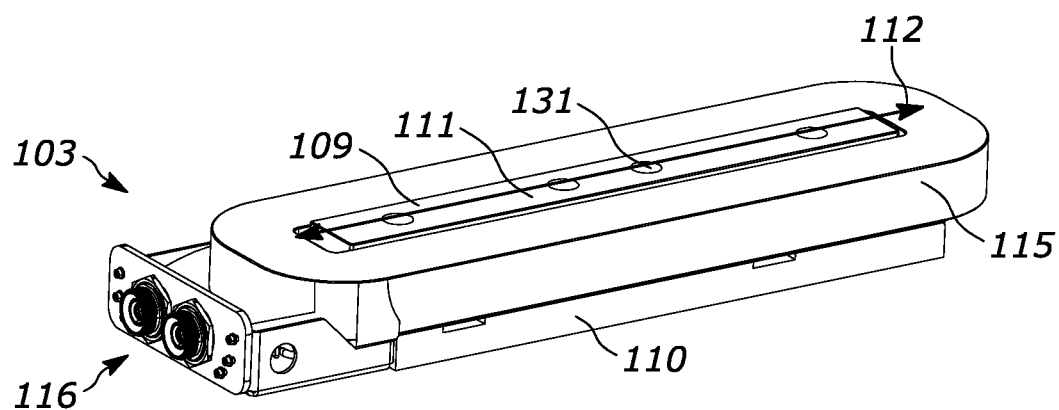
FIG. 4 depicts a section of the electromagnetic actuator of FIG. 3, according to non-limiting examples.

FIG. 1 and FIG. 2 respectively depict: a perspective view and a side view of portion of a system 100 for braking comprising a track 101 and an electromagnetic actuator 102. FIG. 3 depicts a perspective view of the electromagnetic actuator 102 without the track 101. FIG. 4 depicts a perspective view of a section 103 of the electromagnetic actuator 102 without the track 101. As will be described below, the track 101 is generally segmented and hence may interchangeably be referred to as the segmented track 101.

As will be described in more detail below, the electromagnetic actuator 102 is generally controlled to induce eddy currents in the track 101 for eddy current braking of the electromagnetic actuator 102. Hence, the system 100 may alternatively be referred to a braking system and/or an eddy current braking system. Furthermore, the electromagnetic actuator 102 be referred to as an electromagnetic actuator for braking and/or an electromagnetic braking actuator.

The system 100 may generally comprises a sub-system of a high-speed transportation system. Such a high-speed transport system may be deployed on land, underground, overland, overwater, underwater, and the like; a pod and/or payload of the high-speed transport system may comprise a vehicle, and the like, for transporting cargo and/or passengers, and the like, and/or any other suitable payloads. For example, while one electromagnetic actuator 102 is depicted, one or more electromagnetic actuator 102 may be attached to a pod and/or payload (e.g., a vehicle; the terms pod and vehicle will be used interchangeably hereafter), and the like, of the high-speed transportation system, the one or more electromagnetic actuators 102 to interact with the track 101 to brake the pod relative to the track 101. For example, the track 101 (e.g., of a ferromagnetic material) may be mounted adjacent to the electromagnetic actuator 102 and, in operation, the interaction of the electromagnetic actuator 102 with the track 101 may produce a force, which brakes the electromagnetic actuator 102, as well as the pod to which the electromagnetic actuator 102 is attached. Indeed, a plurality of the electromagnetic actuators 102 may be distributed on the pod, adjacent to one or more respective tracks 101.

The track 101 may be mounted in a tube, and/or at a wall, and the like, of the high-speed transportation system, which may be partially evacuated. The pod may include further electromagnetic actuators for propulsion, levitation and/or guidance along respective tracks, in the tube.

The system 100 and/or the track 101 and/or the electromagnetic actuator 102 includes a movement axis 104. In general, the electromagnetic actuator 102 may be mounted to a pod and/or vehicle such that the electromagnetic actuator 102 (e.g., and the pod and/or vehicle) moves in a direction of the movement axis 104 (e.g., "forwards" or "backwards" along the movement axis 104 and/or along the track 101), for example when propelled by a propulsion system.

As best seen in FIG. 1 and FIG. 2, the track 101 comprises segments 105 arranged along the movement axis 104. As depicted, the track 101 is segmented one or more of perpendicular to the movement axis 104 and parallel to the movement axis 104 (e.g., as depicted segmentation is in both directions). However, the segmentations may be in any suitable direction, which may be different from one or more of perpendicular to the movement axis 104 and parallel to the movement axis 104. In general, the track 101 is physically segmented and the segments 105 are generally electrically insulated from one another; in some examples the segments 105 may comprise ferromagnetic steel tiles, which are electrically insulated from one another.

In particular, each of the segments 105 comprises a solid (e.g., unlaminated) ferromagnetic material, which is in contrast to prior art tracks for eddy current braking, which may include solid (e.g., unsegmented and unlaminated) ferromagnetic material and/or non-ferromagnetic and electrically highly-conductive material coated onto a solid (e.g., unsegmented and unlaminated) ferromagnetic or non-ferromagnetic material. In tracks that include solid ferromagnetic material, such as a rail of a train, heating is strictly limited since a small amount of local rail thermal expansion could accumulate to a large expansion and deformation for a continuous rail, which violates the track straightness and tolerance requirements for especially high-speed trains; furthermore, the amount of heat, or braking force, generated is much smaller than the high-speed transportation systems described herein. In tracks that include non-ferromagnetic and electrically highly-conductive material coated onto a solid ferro- or non-ferromagnetic material, eddy currents are generally isolated in the non-ferromagnetic and highly-conductive coatings; further, using non-ferromagnetic and highly-conductive coatings may require a thin layer of this coating to concentrate eddy currents, which reduces the skin depth of eddy currents and increases volumetric heat generation in the thin layer, which creates even higher temperature gradients between the thin layer and bottom solid material, especially for operating at high speeds. Further, using non-ferromagnetic and highly-conductive coatings increases the overall airgap and increases magnetic reluctance (magnetic resistance), reduces the air gap flux density, and reduces the force generation capability; hence systems, which use non-ferromagnetic and highly-conductive coatings, suffer from high volumetric heat concentration, increased airgap magnetic reluctance, and reduced force generation capability, which is not the case in the system 100.

Aspects of the segments 105 will be described in further detail below. Furthermore, while not depicted, it is understood that the track 101 generally includes mounting devices and/or fixed supports (e.g., studs, anchor iron, brackets and the like) arranged in a support structure for mounting the segments 105 to a fixed surface, including, but not limited to, an inside surface of a tube through which the vehicle, to which the electromagnetic actuator 102 is attached, moves. Positions of the mounting devices and/or fixed supports are selected to balance deformation and stresses. There is generally a temperature gradient on the track segments 105 due to the distribution of eddy currents on the surfaces of the track segments 105. These temperature gradients can cause high stresses if the track segments 105 are rigidly constrained to minimize deformation, or they can cause high deformations if the track segments 105 are not constrained at all. Selecting positions of the mounting devices and/or fixed supports to balance the deformation and stresses can be achieved in various ways including, but not limited to, providing a single attachment point at about a center of a respective track segment 105. In this example, a length, width and thickness of the track segment 105 plays a key role, as the single attachment point may enable the track segment 105 to be flexible, and can thus reduce or eliminate the thermal stresses, however the resulting deflections and vibrations may reduce the functionality of the overall braking functionality of the system 100. Nonetheless, vibration and deflections may be reduced using rubber pads, flexible metal springs, and the like, and these components may be selected such that they provide a resistance to deflection of the track segments 105, while being flexible enough such that they do not significantly increase thermal stresses.

Furthermore, the electromagnetic actuator 102 is generally positioned such that a track facing surface of the electromagnetic actuator 102 forms a gap 106 with the track 101 (e.g., as best seen in FIG. 2).

With reference to FIG. 1, FIG. 2, FIG. 3 and FIG. 4, the electromagnetic actuator 102 comprises pole portions 109 extending from one or more back-iron portions 110 (e.g., as best seen in FIG. 4). Each pole portion 109 has a respective pole face 111, for example, which forms the gap 106 with the track 101. While as depicted, the track 101 is located above and/or adjacent to the pole faces 111 of the pole portions 109, the track 101 and the electromagnetic actuator 102 may be provided in any suitable orientation.

The pole portions 109 have respective longitudinal axes 112 arranged about parallel to one another and about perpendicular to the movement axis 104. For example, FIG. 3 shows two such longitudinal axes 112, and FIG. 4 shows a longitudinal axis 112 of the pole portion 109 of the section 103. The movement axis 104 is generally common to the pole portions 109 (and the remaining components of the system 100) and hence may alternatively be referred to as a common movement axis 104. As depicted, the electromagnetic actuator 102 includes sixteen pole portions 109; while not all pole portions 109 are indicated in the figures, for simplicity, it is nonetheless understood that all sixteen pole portions 109 are present.

With reference to FIG. 3 and FIG. 4, each section 103 may include a respective pole portion 109 and a respective back-iron portion 110, the sections 103 may be assembled with longitudinal axes 112 being parallel to each other, such that the back-iron portions 110 form a common back-iron portion 110 of the pole portions 109. Such assembly may occur via a frame, attachment devices (between sections 103 and/or to a vehicle), fasteners and the like. Hence, as described below, magnetic flux may flow between two or more pole portions 109 and the common back-iron portion 110. For simplicity only two longitudinal axes 112 are indicated in FIG. 3, but it is understood that each pole portion 109 includes a longitudinal axis 112.

A length of the longitudinal axes 112 of the pole portions 109, which may also be referred to as a longitudinal length of the pole portions 109, is generally selected to be equal or larger than the total width of the associated segmented track 101 (e.g., as best seen in FIG. 1). The longitudinal length of the pole portions 109 is also generally selected in conjunction with a number of the pole portions 109; for example, for a given braking force the longitudinal length and number of pole portions 109 may be varied such that multiplication of the longitudinal length and number of pole portions 109 may be the same and/or similar, for example to maintain a same and/or similar surface areas of the pole portions 109. Similarly, a width of the segmented track 101 may be varied; however, a larger longitudinal length of the pole portions 109 reacts to a wider portion of the segmented track 101 to reduce volumetric heat and increase vehicle/pod throughput, while a smaller longitudinal length of the pole portions 109 reacts to a narrower portion of the segmented track 101 that increases the volumetric heat but saves track material.

The pole portions 109 are generally spaced along the movement axis 104 according to a pole pitch 114, for example, a center-to-center distance between the pole portions 109. As will be explained in further detail below, the pole pitch 114 of the pole portions 109 is generally selected to induce eddy currents in the associated segmented track 101, such that induced eddy currents are present in a skin depth(s) at more than one surface of respective segments 105 of the associated segmented track 101 when the pole portions 109 (and/or the electromagnetic actuator 102) are moving at given speeds, for example greater than 50 meters/second. Indeed, most of eddy current generated losses are inside the skin depth. Indeed, the pole pitch 114 of the pole portions 109 and the properties of the segments 105 are generally selected such that: eddy current generated losses generally occupy about an entire volume of the associated segmented track 101 and/or the segments 105 below an intermediate speed of the electromagnetic actuator 102 and/or a pod/vehicle to which the electromagnetic actuator 102 is attached; and generated losses occupy at least one third of the track volume at a maximum speed of the electromagnetic actuator 102 and/or a pod/vehicle to which the electromagnetic actuator 102 is attached. In some examples, the maximum speed may be in a range of 600 km/h to 1200 km/h, and the intermediate speed may be in a range of 30% to 60% of a respective maximum speed.

As depicted, the electromagnetic actuator 102 further comprises electrical windings 115, wherein an electrical winding 115 is around a respective pole portion 109, the electrical windings 115 being individually controllable, for example via respective pairs of connectors 116 (e.g., a respective pair of connectors 116 for each section 103). For example, the connectors 116 may be attachable, to plugs and/or connectors of one or more power sources, which may be located at a vehicle on which the electromagnetic actuator 102 is mounted. The power sources may be configured such that power to the electrical windings 115 may be individually controlled, for example such that adjacent pole portions 109 may be controlled to have magnetic poles of different polarities (e.g., alternating north, south, north, south, etc., and/or any other suitable polarities as described in more detail below). Indeed, controlling a direction of current in coils of the electrical windings 115 is generally understood to result in magnetic pole in the pole portions 109, with a magnetic circuit being formed by at least a pair of pole portions 109, the common back-iron portion 110 and the track 101.

As a different pairs of connectors 116 are provided for each of the electrical windings 115 and/or sections 103, the electrical windings 115 are independently controllable and/or powered; hence, when one electrical winding 115 fails, operation of the electromagnetic actuator 102 may continue by continuing to operate the other electrical winding 115.

As best seen in FIG. 2, the electromagnetic actuator 102 may further comprise at least one cold plate 117 configured to cool the electromagnetic actuator 102; as depicted, the at least one cold plate 117 may be positioned to primarily provide cooling for the electrical windings 115, though other components of the electromagnetic actuator 102 may be cooled by the at least one cold plate 117. In some examples, an initial temperature of electromagnetic actuator 102 may be a temperature of a coolant flowing through the at least one cold plate 117. During braking, the temperature of the electrical windings 115 may rise in a short time that approaches or exceeds a temperature value defined by continuous operation for a class of electrical insulation of the electrical winding 115 (e.g., and which may be a maximum recommended operating temperature). For example, after a full emergency braking event, heat accumulated in the electromagnetic actuator 102 may lead to reduced braking force capacity since there may be less thermal capacity to allow the temperature of the electrical windings 115 to rise further during braking, and the at least one cold plate 117 may be positioned against the back-iron portion 110 to mitigate such issues; in other words, as depicted, least one cold plate 117 may be located against the back-iron portion 110 at vehicle facing-side thereof.

In some examples, however, one or more of the cold plates 117 may be replaced with a plate, which may or may not provide cooling functionality. While, hereafter, references are made to a cold plate 117, the term "cold plate" may be replaced throughout with the term "plate" and/or "plate with cooling functionality". For example, a plate with, or without cooling functionality may also have electrical winding retaining functionality, for example as described below. In some examples, such a plate and/or the cold plate 117, may comprise ferromagnetic material to provide magnetic functionality to the plate (e.g., such a plate and/or the cold plate 117, may function as part of the back-iron portion 110).

As also best seen in FIG. 3, the depicted electromagnetic actuator 102 includes sixteen sections 103 (e.g., sixteen pole portions 109), with one cold plate 117 for every four sections 103 (as best seen in FIG. 4). As will be described in detail below with respect to FIG. 15, the sections 103 may be grouped and/or fastened together in modules, which are attached to a cold plate 117. However, the least one cold plate 117 may be configured in any suitable manner.

In some examples, the electrical windings 115 may be removeable for example via straps (not depicted) and the like; hence, when one section 103 fails and/or an electrical winding 115 thereof fails, the electrical winding 115 may be replaced and/or a section 103 may be replaced. Indeed, such a modular approach allows for easy maintenance of the system 100.

With reference to FIG. 2, FIG. 3 and FIG. 4, the electromagnetic actuator 102 generally includes attachment devices 130, for example, bolts and nuts, which insert through respective apertures 131 in the pole portions 109 and the back-iron portions 110, and, which may be used to attach the electromagnetic actuator 102 to a vehicle. Attachment of the electromagnetic actuator 102 to a vehicle is described in more detail below.

Attention is next directed to FIG. 5A and FIG. 5B, which depicts, in a side view, a portion of the track 101 and the electromagnetic actuator 102 in operation with each other as the electromagnetic actuator 102 moves at different speeds in a movement direction 501 along the movement axis 104 (e.g., from left to right in a direction of the pages of FIG. 5A and FIG. 5B). In particular, while a speed of the electromagnetic actuator 102 is referred to hereafter, it is understood that the speed of the electromagnetic actuator 102 is due to the pod and/or vehicle to which the electromagnetic actuator 102 is attached being propelled in the movement direction 501.

In particular, the speed of the electromagnetic actuator 102 in FIG. 5A is slower than the speed of the electromagnetic actuator 102 in FIG. 5B.

As depicted, respective direct currents in the electromagnetic windings 115 are being controlled to produce alternating magnetic poles 502 (e.g., N, S, N, S, etc.) in the pole portions 109 such that when the electromagnetic actuator 102 moves relative to the track 101, magnetic flux is produced, a path 503 of which is depicted in FIG. 5A and FIG. 5B. Furthermore, while the path 503 is depicted as lines, path 503 is generally understood to be three-dimensional and may at least partially be in the gap 106 (e.g., flux leakage).

As depicted, the path 503 of the magnetic flux flows in a magnetic circuit through pole faces 111 of "North" poles", across the gap 106, through the segments 105 (including across gaps therebetween), across the gap 106, through pole faces 111 of "South" poles" (e.g., adjacent to the "North" poles), and through the back-iron portion 110 back to the pole faces 111 of "North" poles". As the electromagnetic actuator 102 is moving, the path 503 of the magnetic flux changes in the segments 105 (e.g., increasing at a front end and/or leading end of the electromagnetic actuator 102 and decreasing at a rear end of the electromagnetic actuator 102), which induces eddy currents in the segments 105.

As such, alternating magnetic poles 504 (e.g., S, N, S, N) of opposite polarity to the poles of the pole faces 111 are induced in the segments 105. Depending on the speed of the electromagnetic actuator 102, opposing or attracting magnetic poles 502, 504 may be about aligned such that, at lower speeds, an attractive force 511 dominates, as in FIG. 5A, or, at higher speeds, an opposing force 512 dominates, as in FIG. 5B. Indeed, at a given speed, the magnetic poles 502, 504 may be spaced about midway between each other there may be a balance between opposing and attractive forces between the magnetic poles 502, 504. Put another way, the eddy currents result in the magnetic poles 504, and their change relative position with speed is generally due to eddy current phase shift in the track 101. Regardless, the magnetic poles 502, 504 result in a braking force 599 in a direction opposite to the movement direction 501.

Hence, kinetic energy of the electromagnetic actuator 102 and the vehicle to which it is attached is electromagnetically converted to electrical loss in the track 101. Put another way, a direct current magnetic field (e.g., represented by the magnetic flux along the path 503) of the electromagnetic actuator 102 induces eddy current in the track 101 due to relative motion therebetween. Track eddy current flows through a skin depth, which also creates surface heating in the segments 105. Skin depth increases as the speed reduces, which means lower loss per unit volume. Both a braking force 599 (e.g., opposite the movement direction 501) and normal forces 511, 512 are generated (e.g., perpendicular to the movement direction 501 and/or the braking force 599). The normal force is attractive at low speed (e.g., the force 511) and repulsive at high speed (e.g., the force 512) due to eddy current phase shift in the track 101 (e.g., such force exists because the track 101 comprises ferromagnetic material).

In general, the size of the pole pitch 114 generally affects both surface eddy current skin depth and hence volumetric heat generation. For example, attention is directed to FIG. 6A, which depict examples of pole portions 109 and electrical windings 115 at two different pole pitches 114-1, 114-2 for a given longitudinal length of the pole portions 109 and a given length in the movement direction 104. For example, the pole pitch 114-1 is about half of the pole pitch 114-2 such that, for the pole pitch 114-1, four sections 103 may be in the given length as compared to two sections 103 in the given length for the pole pitch 114-2.

FIG. 6B schematically shows flux paths 503-1, 503-2 for the pole pitch 114-1 (and specifically for two pole portions 109), while FIG. 6C shows corresponding flux paths 503-1, 503-2 for the pole pitch 114-2. The flux paths 503-1 are through the segments 105 while the flux paths 503-2 are leakage flux paths through the gap 106.

In general, a larger pole pitch 114 and/or increasing the pole pitch 114 may result in the larger track eddy current skin depth and hence smaller track volumetric heat generation (e.g., as the eddy currents are in a larger portion of the segments 105 and/or the track 101), as well as smaller magnetic leakage flux in the gap 106. Hence, the pole pitch 114-2 generally results in larger track eddy current skin depth, smaller track volumetric heat generation and smaller magnetic leakage flux in the gap 106 as compared to the pole pitch 114-1. However, a larger pole pitch 114 may lead to increased size of end windings of the electrical windings 115 (e.g., at longitudinal ends of the pole portions 109), which may increase the width of the electromagnetic actuator 102, as well as reduced brake engine force density and/or may result in increased thickness of the track 101 and/or the segments 105. Hence, it is desirable to select a pole pitch 114, which results in a skin depth, which is many times (for example: 2 to 3 times) larger than a "conventional" rail based eddy current brake to control temperature rise in the track 101 and further results in a high actuator braking force density (for example: >200 N/kg (e.g., size of braking force in "Newtons" compared to weight of the electromagnetic actuator 102 in kilograms)). For example, in conventional eddy current brakes, the braking force density of electromagnetic actuator could be on the order of 20 to 30 N/kg, and the skin depth could be on the order of 5 mm or below when vehicle speed is above 180 km/h (50 m/s).

In general, as the pole pitch 114 increased, the frequency of the change in flux decreases at the track 101, which results in more braking force 599 at higher speeds. In particular each value for a pole pitch 114 has an optimal speed where the braking force 599 is maximized. Hence, a pole pitch 114 may be selected that works the best at a higher speed (e.g., a given higher speed). In general, when selecting the pole pitch 114, a balance is considered between the amount of energy that is transferred into the track 101, and density and/or frequency and/or spatial pitch of the magnetic flux. In particular frequency and/or power is increased (e.g., lower pole pitches), the more power is transferred; hence a smaller pole pitch can lead to a higher braking force 599, but the optimum speed is too low for the speeds of the high-speed transportation system described herein.

One approach to this problem is to control the magnetic pole pitch as a function of speed. While the pole pitch 114 may be a physical distance between the pole portions 109, as the electrical windings 115 around the pole portions 109 are individually controlled, a magnetic pole pitch may be the same as, or different from, the pole pitch 114, and furthermore, a magnetic pole pitch may be controlled based on a speed of the electromagnetic actuator 102.

For example, attention is next directed to FIG. 7A and FIG. 7B, which schematically depict a portion of the electromagnetic actuator 102 in two different modes. The mode of FIG. 7A shows the electrical windings 115 being operated such that the magnetic poles 502 alternate between adjacent pole portions 109, similar to as depicted in FIG. 5A and FIG. 5B. For example, FIG. 7A shows a direction 701 of electrical current through the electrical windings 115 where the direction 701 alternates in adjacent electrical windings 115. Hence, in this example, a magnetic pole pitch 714 (e.g., distance between a "North" pole 502 and a closest "South" pole 502) is the same as the pole pitch 114.

However in FIG. 7B, the electrical windings 115 are being operated such that pairs of adjacent pole portions 109 have a same magnetic pole 502; hence pairs of "North" magnetic poles 502 alternate with pairs of "South" magnetic poles 502. Such control may occur by controlling the direction 701 of electrical current of the electrical windings 115 where, in FIG. 7B, the direction 701 is the same in adjacent pairs of electrical windings 115, but changes to the opposite direction in a next adjacent pair of electrical windings 115. Hence, in this example, in FIG. 7B, the magnetic pole pitch 714 (e.g., a center distance between a pair of "North" poles 502 and a closest pair of "South" poles 502) is twice the pole pitch 114 and/or twice the pole pitch 714 shown in FIG. 7A. As will be discussed below, larger magnetic pole pitch 714 may have advantages at "high" speed while smaller magnetic pole pitch 714 may have advantages at "low" speed.

Furthermore, while only two magnetic pole pitches 714 are depicted in FIG. 7A and FIG. 7B, the electrical windings 115 may be controlled to have larger magnetic pole pitches 714 (e.g., which may be integer numbers of the pole pitch 114; for example, as depicted, the pole pitch 714 in FIG. 7B may be an integer number of "2" times the pole pitch 714 depicted in FIG. 7A).

Hence for example, as depicted, the electrical windings 115 are controllable by a computing device 720 having access to one or more sensors 721 configured to detect a speed of the pole portions 109 and/or the electromagnetic actuator 102 and/or a pod (and/or vehicle) to which the electromagnetic actuator 102 is attached, relative to the associated segmented track 101. As depicted, the computing device 720 is further configured to control one or more power sources 722 used to power the electrical windings 115, for example to change and/or flip direction 701 of the electrical current. The computing device 720, the sensor(s) 721 and the power source 722 may be located at and/or on the pod and/or vehicle to which the electromagnetic actuator 102 is attached.

The computing device 720 may be configured to control polarity of the magnetic poles 502 of the pole portions 109, using the electrical windings 115, based on the speed of the pole portions 109, for example by controlling the power source 722 to control the direction 701 of electrical current in the electrical windings 115. More specifically, the computing device 720 may be further configured to: below a given speed, control the polarity of the magnetic poles 502 of the pole portions 109 (e.g., by changing and/or flipping direction 701 of electrical current electrical windings 115 therearound) such that adjacent pole portions 109 have alternate polarities (e.g., as in FIG. 7A); and above the given speed, control the polarity of the magnetic poles 502 of the pole portions 109 ((e.g., by changing and/or flipping direction 701 of electrical current electrical windings 115 therearound) such that the adjacent pole portions 109 are arranged in respective groups with adjacent respective groups having alternate polarities of magnetic poles 502 (e.g., in FIG. 7B). Put another way, wherein the electrical windings 115 may be controllable by the computing device 720 having access to one or more sensors configured to detect a speed of the pole portions 109 relative to the associated segmented track 101, and the computing device 720 may be configured to control, using the electrical windings 115, and based on a speed of the pole portions 109, one or more of: polarity of the pole portions 109; magnetic flux of the pole portions 109; and braking forces. In other words controlling polarity of the pole portions 109, via the electrical windings 115, based on the speed of the pole portions 109, may result in control of the magnetic flux of the pole portions 109 and/or braking forces of the system 100.

Furthermore, a number of the pole portions 109 in the respective groups may increase with the speed. For example, in FIG. 7B the pole portions 109 are in groups of two, with each adjacent group of two pole portions 109 having alternate polarities of magnetic poles 502. However, the pole portions 109 may be in groups of three, groups of four, etc. the number of groups increasing with speed. Furthermore, the number of pole portions 109 in adjacent groups may be the same or different.

In particular, a smaller magnetic pole pitch 714 may result in generation of a large braking force 599 at low speed, relative to a larger magnetic pole pitch 714; but a smaller magnetic pole pitch 714 may result in generation of a smaller braking force 599 at high speed, relative to a larger magnetic pole pitch 714. Put another way, large magnetic pole pitch 714 may result in generation of a smaller braking force 599 at low speed, relative to a smaller magnetic pole pitch 714; but a larger magnetic pole pitch 714 may result in generation of a larger braking force 599 at high speed, relative to a smaller magnetic pole pitch 714. Hence, at lower speed, a smaller magnetic pole pitch configuration for the electromagnetic actuator 102 may be used, and as the speed increases and/or the speed reaches a given speed, the electromagnetic actuator 102 may be changed to a larger magnetic pole pitch configuration, and vice versa, to maximize braking force 599 for different speed ranges.

However, a size of the segments 105 and/or a type of segmentation of the track 101 may also affect the braking force 599. For example, attention is next directed to FIG. 8, which depicts the system 100 and an example direction 801 of motion thereof (e.g., in the movement axis 104), as well as planes 802 perpendicular to the direction 801 of motion and planes 803 parallel to the direction 801 of motion, the planes 802, 803 showing planes of segmentation of the track 101 (e.g., between the segments 105).

Indeed, FIG. 8 depicts that the track 101 may be segmented in directions that are parallel to the direction 801 of motion and/or that the track 101 may be segmented in directions that are perpendicular to and/or transverse to the direction 801 of motion. However, the track 101 may be segmented in both parallel and perpendicular to the direction 801 of motion. However, the track 101 may be segmented in other shapes and/or directions; for example, the segments 105 may be rectangular (as depicted), square, trapezoidal, rhombus-shaped, triangular, skewed, curved, and the like and/or the segments 105 may be any suitable size.

Indeed, any segmentation of the track 101 may be selected by controlling size and/or shape of the segments 105. Size and/or shape of the segments 105 may affect the braking force on the electromagnetic actuator 102, and hence a size and/or shape of the segments 105 may be selected to maximize braking force, for example at a given speed. Furthermore, as described below, a segmented track 101 may lead to lower thermo-mechanical stress as compared to if the track 101 were continuous; in particular (e.g., see FIG. 12), lowered heating of a segmented track 101 may occur as eddy current flows on all surfaces of the segments 105 (e.g., an actuator and/or gap facing side (e.g., at the gap 106), an opposing side, and edges joining the opposing sides).

For example, attention is directed to FIG. 9A, FIG. 9B, FIG. 9C and FIG. 9D, which depict portions of the system 100 with different segmentations of the track 101. For example, comparing FIG. 9A and FIG. 9B, the track 101 is segmented only in a direction perpendicular to the movement axis 104, with segments 105 in FIG. 9A being larger than segments 105 in FIG. 9B. Similarly, comparing FIG. 9C and FIG. 9D, the track 101 is segmented in a direction perpendicular to the movement axis 104, and a direction parallel to the movement axis 104 with segments 105 in FIG. 9C being larger than segments 105 in FIG. 9D.

In particular, a size of the segments 105 may affect the braking force 599, depending on speed. For example, at lower speeds larger segments sizes may lead to a higher braking force 599 as compared to smaller segment sizes; similarly, at higher speeds, smaller segments sizes may lead to a higher braking force 599 compared to larger segment sizes.

There may be low speed regions of the track 101 where a pod and/or vehicle, to which the electromagnetic actuator 102 is attached, generally travels at slow speeds, for example, close to a station; similarly, there may be high speed regions of the track 101, where a pod and/or vehicle to which the electromagnetic actuator 102 is attached, generally travels at high speeds, for example, midway between stations. Hence, in some examples, low speed regions of the track 101 may comprise low speed segments 105; and high-speed regions of the track 101 may comprise high speed segments; and the high speed segments 105 may be smaller than the low speed segments 105.

Figure 9A:
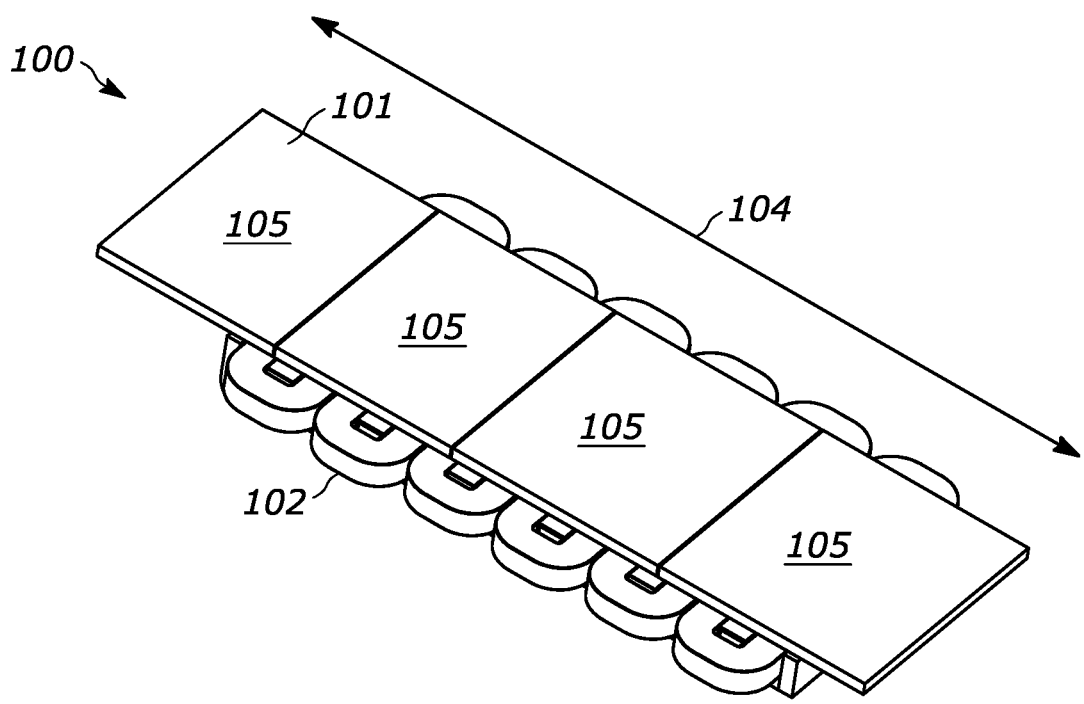
Figure 9B:
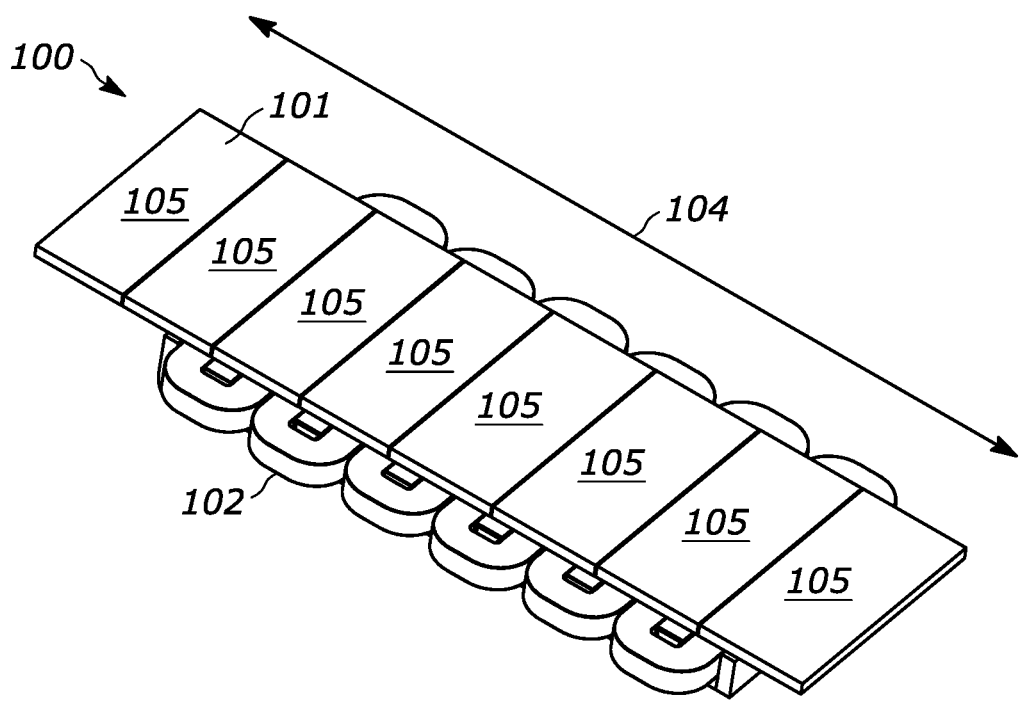
Figure 9C:
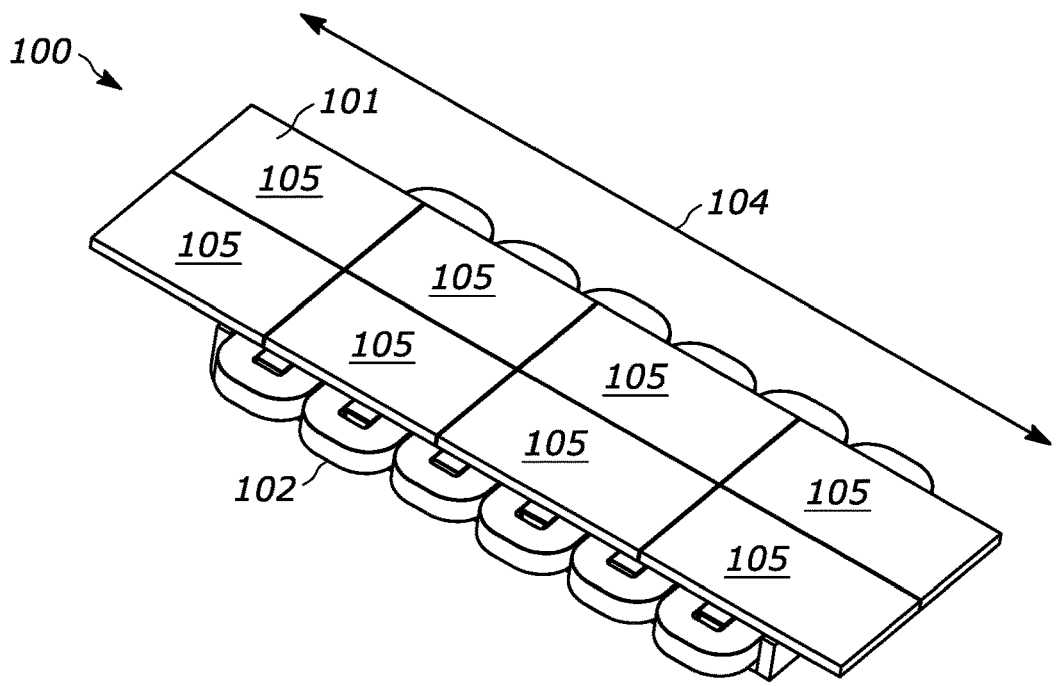
Figure 9D:
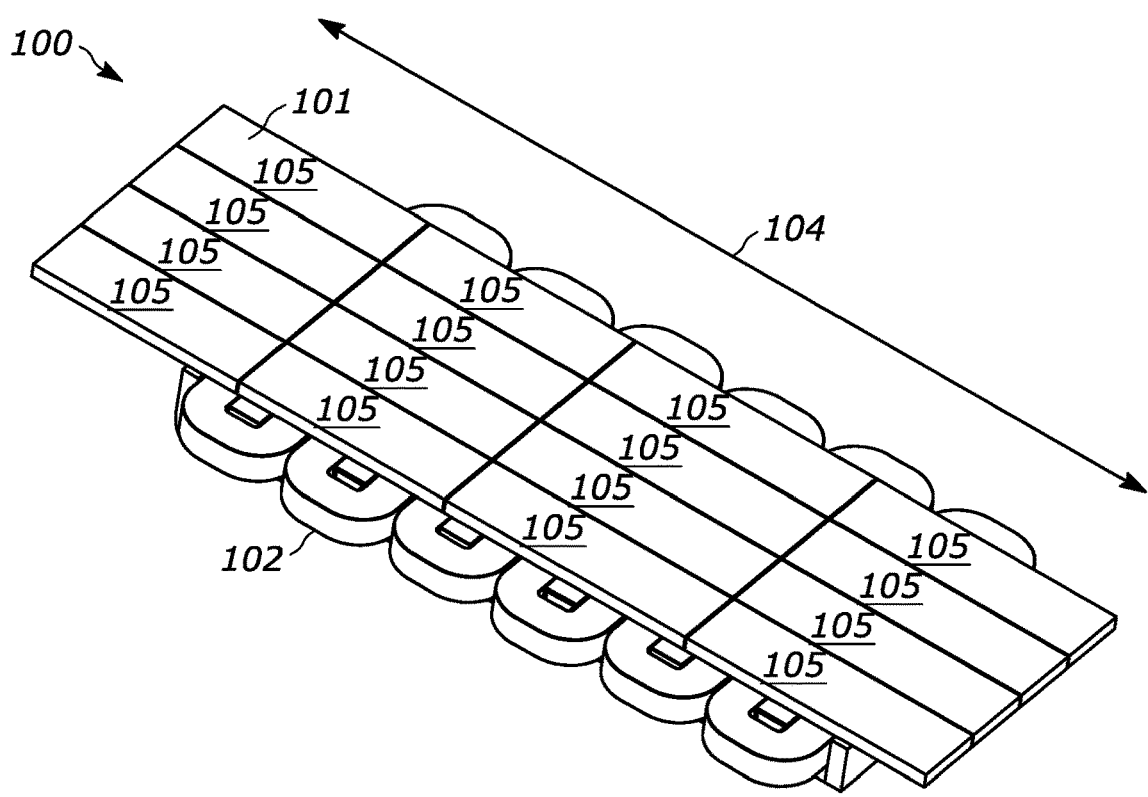

Hence, for example, FIG. 9A and FIG. 9C may depict low speed regions of the track 101, FIG. 9B and FIG. 9D may depict high speed regions of the track 101. Indeed, the segmentation of the track 101 may also impact the normal forces 511, 512.

Attention is next directed to FIG. 10A and FIG. 10B, which respectively depict graphs 1001, 1002 of the braking force 599 as a function of speed for different track segmentations, and normal force 511, 512 as a function of speed for different track segmentations. The values for the forces 511, 512, 599 are normalized in the graphs 1001, 1002.

With reference to the graph 1001, a curve 1011 shows braking force 599 vs speed for an unsegmented track, a curve 1012 shows braking force 599 vs speed for a track with larger segments, a curve 1013 shows braking force 599 vs speed for a track with smaller segments (e.g., smaller than the segments of the curve 1012), and a curve 1014 shows braking force 599 vs speed for a track that is fully laminated (and hence eddy currents are generally minimized. Indeed, from top to bottom, the curves of the graph 1001 show the effect of segmentation size on the braking force 599 at different speeds. Indeed, it is apparent that as the segmentation size reduces the braking force 599 generally decreases for low speeds, but smaller segmentation can lead to peaks in the braking force 599 at higher speeds. However, a segmentation size may be selected, which leads to an about constant braking force at over a large range of higher speeds, for example as seen in the curve 1013. Indeed, lower speed regions of the track 101 may have a larger segmentation with braking force optimized for a given speed, for example, a peak in the larger segmentation curve 1012. Indeed, FIG. 10A shows that segmentation may be selected for a region of the track 101 based on expected speed in that region.

Similarly, FIG. 10B shows the effect on the normal force 511, 512 by speed. With reference to the graph 1002, a curve 1021 shows normal force 511, 512 vs speed for a continuous (unsegmented) track, a curve 1022 shows normal force 511, 512 vs speed for a track with larger segments, a curve 1023 shows normal force 511, 512 vs speed for a track with smaller segments (e.g., smaller than the segments of the curve 1022), and a curve 1024 shows normal force 511, 512 vs speed for a track that is fully laminated. The curves 1021, 1022, 1023, 1024 correspond to respective similar segmentation of the track 101 as for the curves 1011, 1012, 1013, 1014.

In the graph 1002, forces above the "0" force line are repulsive forces 512 and forces below the "0" force line are attractive forces 511. In general, other actuators attached to the pod and/or vehicle to which the electromagnetic actuator 102 is attached may be controlled (e.g., via the computing device 720, and the like) to counteract the normal force 511, 512, presuming the behavior of the normal forces 511, 512 is known as a function of speed, for example for a known given segmentation. However, the ability of the other actuators to counteract the normal force 511, 512 may be used to set boundaries on the segmentation.

For example, attention is next directed to FIG. 11A and FIG. 11B, which respectively depict graphs 1101, 1102 of the braking force 599 as a function of speed for different track segmentations, and normal force 511, 512 as a function of speed for different track segmentations. The values for the forces 511, 512, 599 are normalized in the graphs 1101, 1102 and for a subset of the curves of the graphs 1001, 1002, with the normalization being in a region of about constant force. The curves 1111, 1121 are for larger segmentation and the curves 1112, 1122 are for smaller segmentation. The line 1130 in the graph 1102 indicates a line of maximum repulsive force 512 that the other actuators attached to the pod and/or vehicle to which the electromagnetic actuator 102 may be capable of counteracting. The line 1160 in the graph 1102 indicates a line of maximum attractive force 511 that the other actuators attached to the pod and/or vehicle to which the electromagnetic actuator 102 may be capable of counteracting. Hence, segmentation may be selected such that at a maximum speed of the pod and/or vehicle the repulsive force 512 does not exceed the force represented by the line 1130.

Hence, for example, for a track 101 segmented according to the larger segmentation of the curve 1121, the speed cannot exceed the line 1131, whereas for a track 101 segmented according to the smaller segmentation of the curve 1122, the speed cannot exceed the line 1132. In general, the speed represented by the line 1132 is larger than the speed represented by the line 1131. The lines 1141, 1142 on the graph 1101 correspond to respective speeds of the lines 1131, 1132 and show that the braking force 599 is about constant therebetween.

The graphs 1001, 1002, 1101, 1102 generally show that a combination of different track segmentations may be used in different regions and/or zones where different zones have a pre-defined speed and/or velocity limit. To maximize the braking force 599 in each zone, small segmentation may be used for high speed zones, whereas large segmentation may be used for low speed zones. Actuators of a vehicle and/or pod to which the electromagnetic actuator 102 is attached are selected to withstand a pre-defined maximum normal force 511, 512 during operation of the electromagnetic actuator 102 and, which may be controlled via the segmentation. A smooth transition between zones may be achieved for example by providing transitional zones between low-speed zones and high-speed zones, the transitional zones comprising track segments of an intermediate segmentation (e.g., intermediate small segmentation of a high speed zone, and large segmentation of a low speed zone), and/or by controlling the current in the electrical windings 115 to limit a jerk rate.

Put another way, in some examples: low-speed zones and/or regions of the track 101 may comprise low-speed segments 105; high-speed zones and/or regions of the track 101 may comprise high-speed segments 105, and transitional zones and/or regions of the track 101 may comprise transitional segments 105, a transitional zone and/or region located between a low-speed region and a high-speed region, wherein the high-speed segments 105 are smaller than the low-speed segments 105, and the transitional segments 105 are larger than the high-speed segments 105 and smaller than the low-speed segments 105.

The thickness of the segments 105 may be generally selected to be at least two times a minimum eddy current skin depth when the pole portions 109 are moving at a maximum speed and/or velocity for a respective speed zone and/or region. In high-speed zones the eddy current skin depth may be smaller than the eddy current skin depth in the low-speed zones. Hence, the thickness of high-speed track segments 105 may be less than or equal to a respective thickness of the low-speed segments 105. Similarly, a respective thickness of transitional-zone track segments 105 may be between the respective thicknesses of the high-speed track segments 105 and the low-speed segments 105. Put another way, respective thickness of respective segments 105 of low-speed zones (and/or low-speed regions), the high-speed zones (and/or high-speed regions) and the transitional zones (and/or low-speed regions) may be at least two times a minimum eddy current skin depth when pole portions 109 of the electromagnetic actuator 102 are moving at a given respective maximum velocity for a respective zone (and/or respective region).

Furthermore, dimensions of the segments 105 may be selected such that a braking force 599 on the electromagnetic actuator 102, due to eddy currents induced in the segments 105 by the electromagnetic actuator 102, is about constant above a given speed of the electromagnetic actuator. For example, with reference to the graph 1101, above a given speed 1150, the braking force 599 is about constant for the curves 1111, 1112.

Other aspects of the system 100 will now be described.

Attention is next directed to FIG. 12, which depicts cross-sections of segments 105 showing average eddy current distribution in the segments 105, at a given speed (e.g., as the electromagnetic actuator 102 interacts with a segment 105). The lighter regions on surfaces of the segments 105 show regions of higher eddy currents, whereas dark regions in the center of the segments 105 show regions of lower eddy currents. In particular, the eddy currents are generally over all surfaces of a segment 105 (e.g., to a skin depth), which results in the heat that is generated also being distributed over all surfaces of a segment 105. Put another way, electromagnetic iron loss in the segments 105 occurs over all the surfaces.

It is also understood from FIG. 12 that components of the system 100 are selected such that induced eddy currents in the segments 105 are present in a skin depth at more than one surface of the segments 105 when the pole portions 109 are moving at given speeds, for example greater than 50 meters/second. Indeed, most of the eddy current generated losses are inside the skin depth. It is understood from FIG. 12 that the skin depth of the eddy currents may be about 50% of the thickness of the segments 105, and the eddy current generated losses occupy about an entirety of a volume of a segment 105, for example at or below a given speed (e.g., a given intermediate speed less than a given maximum speed) of the pole portions 109; as the speed of the pole portions 109 increases, however, the eddy current generated losses may occupy at least one third of the volume of a segment 105 at a given maximum speed greater than the given intermediate speed. In some examples, the maximum speed may be in a range of 600 km/h to 1200 km/h, and the intermediate speed may be in a range of 30% to 60% of a respective maximum speed.

In contrast, conventional tracks that use continuous plates (or very large segments, relative to the segments 105) only allow eddy current to form at one surface that faces an actuator. However, the segmented track 101 as described herein allows eddy currents to form on all surfaces of the segments 105; this may significantly increase a volume of an electromagnetic iron loss zone and reduce volumetric heat generation, thus reducing the maximum temperature of the track 101 and reducing thermal/mechanical stress at the track 101. Such an approach may also allow more vehicles to brake at a same time, as braking distance is reduced, increasing the throughput of a high-speed transportation system.

While not described in detail, selection of material for the segments 105 may also improve the braking force 599. For example, as electrical resistivity of a material of the track 101 increases, the braking force 599 may increase for a given speed and track eddy current skin depth may increase, which may reduce track volumetric heat concentration and track heating problems; similarly, normal force (repulsive) may be reduced in high speed regions, which may assist in reduces size and weight of an electromagnetic actuator that counteracts the normal forces.

In some examples, force ripple may occur as the electromagnetic actuator 102 moves across the segments 105 and specifically across gaps between the segments 105. However, such force ripple may be reduced by selecting a suitable track segment pitch such that pole portions 109 and gaps between the segments 105 do not all align at a same time.

For example, attention is next directed to FIG. 13A, which shows six example poles (e.g., pole portions 109 and/or magnetic poles) with the pole pitch 114 and an example track segment pitch 1314, which may be center-center distance of adjacent segments 105 along the movement axis 104.

The segment pitch 1314 may be determined from the following:

$$\text{Segment Pitch} = \text{Pole Pitch} \times n/k \qquad \text{Equation (1)}$$

In Equation (1), N is the number of pole portions 109 of the electromagnetic actuator 102 and k is the number of track segments 105 adjacent and/or under and/or over the entire number "N" of the pole portions 109 of the electromagnetic actuator 102, and/or "k" is the number of track segments 105 with which the pole portions 109 of the electromagnetic actuator 102 are interacting (e.g., through which magnetic flux flows due to the pole portions 109 to induce eddy currents in the k" number of track segments 105). To reduce force ripple, the Greatest Common Divisor (and/or Denominator) (GCD) between "N" and "k" may be selected to be 1. However, in some examples a GCD of "1" may be challenging to achieve; hence, rather than "1", various values of "N" and "k" may be selected having a GCD that is as small of an integer value as possible. In a particular example, for N=6, "k" may be 5 or 7, with a GCD of 1. Hence, for example, when N=6 and k=7, it is understood that there are six (6) pole portions 109 in total at the electromagnetic actuator 102, which are interacting with seven (7) track segments 105; the GCD of N=6 and k=7 is further understood to be 1.

Put another way, the electromagnetic actuator 102 may comprise a given number N of the pole portions 109, and a track segment pitch 1314 (e.g., of the segments 105), parallel to the movement axis 104, is determined from the pole pitch 114, and a ratio of the given number of the pole portions 109 to a number of the track segments 105 with which the given number of the pole portions 109 are interacting and/or inducing eddy currents (e.g., a number of track segments 105 adjacent and/or under and/or over the entire number "N" of the pole portions 109 of the electromagnetic actuator 102). The number "k" of track segments 105 is further selected so that the GCD between "N" and "k" is 1, or as small of an integer as possible. Indeed, in general, one or more of the pole pitch 114 and a track segment pitch 1314, parallel to the movement axis 104, is selected to reduce force ripple as the electromagnetic actuator 102 moves along the segments 105 of the track 101. In general, the pole pitch 114 and the track segment pitch 1314 are selected to minimize alignments between gaps of the pole portions 109 and respective gaps between the segments 105 of the track 101.

Such a selection of the track segment pitch 1314 may cause the force ripples from all the pole portions 109 to be uniformly out-of-phase, so that a positive peak force of one pole portion 109 is canceled by the negative peak force of another other pole portion 109. For example, FIG. 13B shows a graph of the normalized braking force 599 for each of the six pole portions 109 at a given position relative to the track 101, with the track segment pitch 1314 according to Equation (1), and FIG. 13C shows a sum of the normalized braking forces 599 of the graph of FIG. 13B. In particular, the sum of the normalized braking forces 599 of the graph of FIG. 13B is about constant as a function of distance.

In particular examples, an electromagnetic actuator 102 may be provided with a pre-selected number pole portions 109 with a given pole pitch 114 and a track segment pitch 1314, which may be selected to reduce and/or minimize the total actuator force ripple. For a given number of pole portions 109 and a given pole pitch 114, there may be a plurality of track segment pitches that minimize the total actuator force ripple. For example, with reference to Equation (1), for N=16 (e.g., 16 pole portions 109), "k" may equal 15, 13, 11, 9, 7 or 5, according to Equation (1), to achieve adequate and/or minimal force ripple reduction. For each of k being 15, 13, 11, 9, 7 or 5, a smallest GCD with respect to N=16 is "1". For another example, for N=8, k may equal 7, 5, 3 according to Equation (1) to achieve adequate and/or minimal force ripple reduction. For each of "k" being 7, 5, or 3, a smallest GCD with respect to N=8 is "1"; in this case, when a pole pitch 114 is pre-selected as, for example, 300 mm, the track segment pitch may be determined to be 342.9 mm, 480 mm, and 800 mm, respectively for k being 7, 5, and 3. As there is usually more than one available track segment pitch to select based on the above criterion, other factors may be considered when selecting an appropriate track segment pitch including, but not limited to operating speeds, track mechanical stress and deflections. For example, lower speeds may lead to a larger track segment pitch than at higher speeds (e.g., of track segments 105 in a low-speed zones may have a larger segment pitch than respective track segments 105 of high-speed zones, as described above). Furthermore, a smaller track segment pitch may reduce track mechanical stress and deflections, as compared to a larger track segment pitch, as forces may be more evenly distributed amongst more track segments.

Attention is next directed to FIG. 14, which depicts electrical connections to the electromagnetic actuator 102. In particular, each pair of connectors 116 of a section 103 may be connected to a single Brake Converter Module (BCM), which may regulate power and/or a direction of the power, and the like, to a section 103 and in particular electrical windings 115 of a respective section 103. An BCM may alternatively be referred to as a power regulator.

As depicted, the sections 103 are connected in pairs to a High Voltage Interface (HVI), which provides power to the BCMs. An HVI and respective BCMs may alternatively be referred to as a power source, such a power source 722 described above.

Such a modular approach to powering the electrical windings 115 may reduce power requirements and increase fault tolerance and/or reliability.

Attention is next directed to FIG. 15A and FIG. 15B, which depict a perspective view of the electromagnetic actuator 102 and a perspective view of a module 1503 thereof. For example, the sections 103 may be grouped and/or attached into modules 1503; as depicted, a module 1503 may comprise a group of four sections 103.

Between each module 1503, a clearance gap may be provided in a direction of the movement axis 104, to allow for thermal expansion of individual modules 1503 along the movement axis 104. Such modules 1503 may further increase maintainability and replaceability. As will be described below, each module 1503 may transfer braking load through a shear lip, for example through a respective cold plate 117. Hence, the braking load may be distributed over the modules 1503 (e.g., as depicted four modules 1503) of the electromagnetic actuator 102.

In some examples, there may be four sections 103 per module 1503, and the four sections 103 may be assembled into a module 1503 via a non-ferromagnetic interface plate 1504 via any suitable fasteners (e.g., bolts, pins, and the like). In some examples, the modules 1503 may be of different types: central modules 1503 and end modules 1503. In particular, FIG. 15B depicts an end module 1503, which includes an end tooth 1505. The end tooth 1505 is similar to a pole portion 109 but is external to the electrical windings 115 and is located at a leading or trailing end of the electromagnetic actuator 102 when the modules 1503 assembled. The end tooth 1505 may assist in directing magnetic flux in the electromagnetic actuator 102.

Attention is next directed to FIG. 16A and FIG. 16B, which schematically depict, respectively a module 1503 attached to a vehicle, and a vehicle facing side of a module 1503. A cold plate 117 is located between the module 1503 and a vehicle surface 1601. With reference to FIG. 16A, the module 1503 is attached to the vehicle surface 1601 via nuts and bolts through bolt clearance holes of the module 1503, the vehicle surface 1601, and the cold plate 117. A shear lip 1603 projects up from the vehicle surface, which, with reference to FIG. 16B, extends through a cutout in the cold plate 117 to mate with a shear lip cutout 1604 in the module 1503 (as depicted the interface plate 1504 is between the cold plate 117 and the back-iron portion 110). In general the cutout in the cold plate 117 may be of a size and shape to enable the shear lip 1603 to extend therethrough, without contacting the cold plate 117 such that the interface of the shear lip cutout 1604 with the shear lip 1603 generally transfers the braking force 599 to the vehicle. The bolts generally hold the module 1503 to the vehicle surface 1601, generally constraining to the module 1503 in a direction perpendicular to the movement axis 104.

Attention is next directed to FIG. 17, which depicts a view of an example cold plate 117. The example cold plate 117 includes a shear lip cutout, a cooling channel through which a cooling liquid may be pumped (e.g., via a cooling system of the vehicle, which interfaces with cooling liquid connectors (not depicted) of the cold plate 117), as well as various holes for bolts to attach a module 1503 to the vehicle and/or to attach the cold plate 117 to the interface plate 1504. Further holes may be provided for pins that mount the sections 103 to the interface plate 1504.

Further aspects of electromagnetic actuators provided herein are next described.

Attention is next directed to FIG. 18, which is substantially similar to FIG. 14, with like components having like numbers. In particular, FIG. 18 depicts electrical connections to an electromagnetic actuator 1802 that is substantially similar to the electromagnetic actuator 102. Like the electromagnetic actuator 102, the electromagnetic actuator 1802 comprises sections 1803, having respective pole portions 1809, electrical windings 1815 and a pair of electrical connectors 1816, respectively substantially similar to the pole portions 109, electrical windings 115 and connectors 116. Furthermore, while other components are not indicated, is generally understood that the electromagnetic actuator 1802 includes other suitable components described above with respect to the electromagnetic actuator 102 including, but not limited to a back-iron (e.g., similar to the back-iron portions 110).

While for simplicity in FIG. 18, only one section 1803, pole portion 1809 and electrical windings 1815 are numbered, it is understood that the electromagnetic actuator 1802 comprises sixteen sections 1803. The connectors 1816 on either side of the electromagnetic actuator 1802 are more generally indicated.

For example, for clarity, also indicated are a first side 1821 of the electromagnetic actuator 1802, a second side 1822 of the electromagnetic actuator 1802 (opposite to the first side 1821), a first end 1831 of the electromagnetic actuator 1802, and a second end 1832 of the electromagnetic actuator 1802 (opposite to the first end 1831). The ends 1831, 1832 are understood to be about perpendicular to a longitudinal axis and/or movement axis 1844 of the electromagnetic actuator 1802 (e.g., similar to the movement axis 104), for example at a leading and trailing ends of the electromagnetic actuator 1802. The sides 1821, 1822 are understood to be about parallel to the movement axis 1844 of the electromagnetic actuator 1802, with the connectors 1816 located at the sides 1821, 1822. Also depicted in FIG. 18 is a center line 1854 of the of the electromagnetic actuator 1802, about perpendicular to the movement axis 1844.

As depicted, the sections 1803 of the electromagnetic actuator 1802 are grouped on opposite sides of the center line 1854. In particular, a first half of adjacent sections 1803 (e.g., between the first end 1831 and the center line 1854, further numbered from 1-1 to 8-1, starting from the first end 1831) have connectors 1816 on the first side 1821 of the electromagnetic actuator 1802. Similarly, a second half of adjacent sections 1803 (e.g., between the second end 1832 and the center line 1854, further numbered from 1-2 to 8-2, starting from the second end 1832) have connectors 1816 on the second side 1822 opposite the first side 1821.

This is in contrast to the electrical connectors 116 of adjacent sections 103 of the electromagnetic actuator 102, depicted in FIG. 14, which alternate between sides of the electromagnetic actuator 102. The arrangement of connectors 1816 in FIG. 18 may simplify electrical connections and/or wiring in the electromagnetic actuator 1802.

For example, the connectors 1816 of the sections 1803 may be electrically connected to a respective BCM (e.g., a power regulator) via electrical connections and/or wiring and/or cables, and the like, shown as arrows from a BCM to given sections 1803. Hereafter a BCM being described as electrically connected to a section 1803 is understood to include the BCM being electrically connected to electrical connectors 1816 thereof via wiring and/or cables and the like, as well as suitable electrical fittings attached to the electrical connectors 1816.

The BCMs generally regulate power and/or a direction of power, and the like, to a section 1803 and in particular electrical windings 1815 of a respective section 103, as described previously. Furthermore, it is understood that the sections 1803 may be connected, via the BCMs, to HVIs (e.g., power sources which provide power to the BCMs). It is furthermore understood that, for the sixteen sections 1803, there are eight BCMs (e.g., one BCM for two sections 103 and numbered from 1 to 8) and eight HVIs (also numbered from 1 to 8); hence, a given BCM is connected to two sections 1803, one section 1803 on each of the first side 1821 and the second side 1822 of the electromagnetic actuator 1802, and/or one section 1803 on each side of the center line 1854.

While the BCMs in FIG. 18 are depicted on both sides 1821, 1822 of the electromagnetic actuator 1802, it is understood that the BCMs are generally arranged along the movement axis 1844 (e.g., and mounted on vehicle to which the electromagnetic actuator 102 is attached) and a same BCM is connected to two sections 1803, one on each side 1821, 1822. As such, the depiction of the BCMs in FIG. 18 indicates BCM connections to the various sections 1803, with the BCMs labelled accordingly. For example, a "BCM1" (e.g., at "Side 1" connected to HVI#1) is shown as connected to the section 1803 labelled 1-1 at the side 1821, and the "BCM1" (e.g., at "Side 2" connected to HVI#1) is shown as also being connected to the section 1803 labelled 1-2 at the side 1822.

To facilitate symmetrical failure modes, and/or symmetrical changes to a pitch moment of force (e.g., without introducing additional pitch moment to the vehicle to which the electromagnetic actuator 1802 is attached), when power to a BCM is cut, in the electromagnetic actuator 1802, a given BCM is electrically connected to two respective sections 1803 that are symmetrically arranged in the electromagnetic actuator 1802 with respect to the center line 1854.

For example, a given BCM is electrically connected to a first section 1803 that is a given number of sections 103 (and/or a given distance) from the center line 1854 towards the first end 1831, and the given BCM is connected to a second section 1803 that is the same given number of sections 103 (and/or the same given distance) from the center line 1854 towards the second end 1832.

Hence, when the given BCM and/or a connected HVI fails, and/or power is cut to the given BCM and/or HVI (e.g., due to a magnetic flux change and/or temperature change of a section 1803 as described below), the two corresponding sections 1803 will also fail (and/or be turned off) symmetrically about the center line 1854. As such, magnetic flux generated by the electromagnetic actuator 1802 changes symmetrically with respect to the center line 1854. Similarly, the various forces in the electromagnetic actuator 1802, produced by the sections 1803 (e.g., and the track 101) will change symmetrically. Put another way, a change in pitch moment of force and/or inertia will occur symmetrically about the center line 1854 when a given BCM and/or HVI fails, and/or power is cut thereto, which may prevent a change in pitch moment of force and/or inertia from "rocking" the electromagnetic actuator 1802 and/or a vehicle to which the electromagnetic actuator 1802 is attached.

Furthermore, to simplify wiring in the electromagnetic actuator 1802, starting from the first end 1831 at the first side 1821, alternating sections 1803 are connected to BCMs alternating between the first end 1831 and the second end 1832, for example, starting from a closest BCM to the first end 1831, then a closest BCM to the second end 1832, then a next closest BCM to the first end 1831, then a next closest BCM to the second end 1832, and so on.

Similarly, starting from the second end 1832 at the second side 1822, alternating sections 1803 are connected to BCMs alternating between the first end 1831 and the second end 1832, starting from a closest BCM to the first end 1831, then a closest BCM to the second end 1832, then a next closest BCM to the first end 1831, then a next closest BCM to the second end 1832, and so on.

In this arrangement, symmetrical connections about the center line 1854 are maintained between the BCMs and the sections 1803 and furthermore, wiring between the BCMs and the sections 1803 may be minimized.

Hence, for example, a first BCM 1 is electrically connected to a closest section 1803 (1-1) to the first end 1831 and a closest section 1803 (1-2) to the second end 1832. A last BCM 8 is electrically connected to a next (and/or second) closest section 1803 (2-1) to the first end 1831 and a next (and/or second) closest section 1803 (2-2) to the second end 1832. A second BCM 2 is electrically connected to yet a next (and/or third) closest section 1803 (3-1) to the first end 1831 and yet a next (and/or third) closest section 1803 (3-2) to the second end 1832, and so on.

Attention is next directed to FIG. 19, which depicts various sensors that may be deployed in conjunction with any of the electromagnetic actuators 102, 1802 described herein, though examples of such sensors are described with respect to the electromagnetic actuator 1802.

As depicted, the electromagnetic actuator 1802 is adapted to include magnetic flux sensors 1901, and temperature sensors 1902. Furthermore, gap sensors 1903 are provided external to the electromagnetic actuator 1802, for example at the vehicle to which the electromagnetic actuator 1802 is attached and/or mounted to the track 101 and/or mounted to a tube, and the like, to which the track 101 is mounted.

Regardless, the sensors 1901, 1902, 1903 are depicted as being communicatively coupled with a computing device 1920, which controls power to power sources 1922 (e.g., the HVIs) of the electromagnetic actuator 1802. While the power sources 1922 are not depicted as being connected to the sections 1803, it is understood that such power sources 1922 are connected to the sections 1803 as depicted in FIG. 18 (e.g., via the BCMs). Furthermore, while the sensors 1901, 1902, 1903 are depicted as being both deployed on, or adjacent, to the electromagnetic actuator 1802, and as being separately communicatively coupled to the computing device 1920, it is understood that the electromagnetic actuator 1802 (and a vehicle thereof) comprises wiring and/or harnessing and/or communication links connecting the sensors 1901, 1902, 1903 to the computing device 1920.

The computing device 1920 may be substantially similar to the computing device 720; as such, the computing device 1920 may be further communicatively coupled to the one or more sensors 721 configured to detect a speed such that the computing device 1920 may control a pole pitch of the sections 1803 as described above. Alternatively, the electromagnetic actuator 102 (and an associated vehicle) may be adapted to include the sensors 1901, 1902, 1903 with the computing device 720 adapted as described hereafter.

While not depicted, it is understood that the sections 1803 are generally adapted to include any suitable combination of grooves, apertures, and the like, to provide a harness and/or wiring between the sensors 1901, 1902 and the computing device 1920. In general, such grooves may be along a bottom of a pole portion 1809 (e.g., between a pole portion 1809 and a back-iron, etc. and/or along a back-iron). Regardless, such an adaption is selected to minimize physical alterations to pole face of the pole portions 1809, for example to minimize their impact on magnetic flux through the pole faces. In other examples, the sensors 1901, 1902 may be adapted for wireless communication with the computing device 1920, with the computing device 1920 adapted for such wireless communication (e.g., via one or more wireless transceivers and the like).

When mounted to the track 101 and/or mounted to a tube, and the like, to which the track 101 is mounted, gap sensors 1903 are understood to be in wireless communication with the computing device 1920. Otherwise, wiring between the gap sensors 1903 and the computing device 1920 may be located at the vehicle to which the electromagnetic actuator 1802 is attached; however, in other examples, the gap sensors 1903 mounted to the vehicle may alternatively be in wireless communication with the computing device 1920.

Functionality of the sensors 1901, 1902, 1903, in conjunction with the computing device 1920, will next be described.

The various magnetic flux sensors 1901 are positioned, and generally configured, to measure magnetic flux through the pole portions 1809 (e.g., perpendicular to pole faces of the pole portions 1809), which, as has previously been described with respect to the electromagnetic actuator 102, is related to braking force and/or normal force of the electromagnetic actuator 1802. A particular braking force and/or normal force produced for a given magnetic flux (and/or for a given signal from a magnetic flux sensor 1901) may be provided in a look-up table, for example stored at the computing device 1920.

Such magnetic flux sensors 1901 may include Hall sensors and/or any suitable magnetic flux sensors, arranged to detect magnetic flux through the pole faces of respective pole portions 1809. Furthermore, such magnetic flux sensors 1901 may be selected to withstand heat produced during braking, as described above.

While only four magnetic flux sensors 1901 are indicated in FIG. 19, for example at sections 1803 closest to the ends 1831, 1832, it is understood that there are two magnetic flux sensors 1901 per section 1803, for example arranged along center lines of pole portions 1809 for example to symmetrically measure magnetic flux at a section 1803 and/or for redundancy. Hence, the positions of the magnetic flux sensors 1901 are selected to be symmetrical with regards to the pole faces of the pole portions 109.

Also depicted in outline in FIG. 19 are eight track segments 105 (though only two track segment 105 are numbered), arranged in groups of four from side 1821 to side 1822, with lateral gaps 1951 between laterally adjacent segments 105, and longitudinal gaps 1952 between longitudinally adjacent segments 105. While only eight segments 105 are depicted in a particular arrangement, it is understood that the segments 105 generally form the track 101 and extend past the ends 1831, 1832 of the electromagnetic actuator 1802, and further that the segments 105 may have any suitable geometry (e.g., as described above at least with respect to FIG. 8, FIG. 9, FIG. 10 and FIG. 11).

In FIG. 19, the track segments 105 are depicted to show relative positions of the magnetic flux sensors 1901 to the track segments 105. In particular, a position of a magnetic flux sensor 1901 at a pole portion 1809, in addition to being arranged along center lines of pole portions 1809, is selected to be about centered on a track segment 105 and/or selected to maximize a distance from the lateral gaps 1951 between laterally adjacent track segments 105 that are about parallel to the movement axis 1844. Hence, when the electromagnetic actuator 1802 moves side to side (e.g., perpendicular to the movement axis 1844), a chance of a magnetic flux sensor 1901 losing and/or reducing signal, due to being close to a gap between adjacent track segments 105, is minimized.

Hence, as braking may be bidirectional (e.g., in either direction along the movement axis 1844), such a symmetrical arrangement allows the same look-up tables for the magnetic flux sensors 1901 to be used whether braking is in a first direction and/or forward direction, or in a second direction opposite to the first direction and/or a reverse direction (e.g., rocking due to braking may differ in a forward direction, or reverse direction, though such differences may be symmetrical; hence, such a symmetrical arrangement of magnetic flux sensors 1901 may account for such differences).

As depicted, two magnetic flux sensors 1901 are positioned at respective pole faces of respective pole portions 1809 so that magnetic flux may be measured across a respective section 1803, and furthermore magnetic flux may be measured across the electromagnetic actuator 1802. Hence, signals from the magnetic flux sensors 1901 received at the computing device 1920 may be used in a feedback loop to control, and/or evenly control, power to the electrical windings 1815 (e.g., via power sources 1922) to control braking forces and/or normal forces across the electromagnetic actuator 1802 and/or pole portions 1809. Put another way, the computing device 1920 may be communicatively coupled to the magnetic flux sensors 1901, and the computing device 1920 may be configured to control braking forces and/or normal forces across the electromagnetic actuator 1802 and/or pole portions 1809 based on magnetic flux measured by the magnetic flux sensors 1901.

In a particular example, the braking forces and/or normal forces are controlled by the computing device 1920 to be about the same and/or about symmetrical across the electromagnetic actuator 1802/or pole portions 1809.

Furthermore, signals from such magnetic flux sensors 1901 may be used by the computing device 1920 to detect when a failure occurs at a section 1803 and/or an adjacent section 1803 (e.g., as magnetic flux tends to flow through adjacent sections 1803, back-iron portions, and the track 101, as described above). For example, a failure may be detected when the computing device 1920 determines, from signals from the magnetic flux sensors 1901, that a drop and/or change in magnetic flux that occurs at a pole portion 1809 meets predetermined threshold conditions. Such a failure may be due to a failure of a BCM and/or an HVI and/or due to a short in electrical windings 1815. When a failure at a section 1803 is detected, the computing device 1920 may cut power to the section 1803, and/or an adjacent section 1803 (e.g., and corresponding symmetrical sections 1803 on an other side of the center line 1854, as described above). The computing device 1920 may further control the remaining sections 1803, that have not failed, to compensate for such a failure, for example to increase and/or change power to electrical windings 1815 thereof to increase braking forces, and the like, at the remaining sections 1803. Similarly, the computing device 1920 may further control the remaining sections 1803, that have not failed, to provide additional compensation for such a failure, for example to balance and/or cancel a pitch moment on the vehicle (e.g., to which the electromagnetic actuator 1802 is attached) and the like, for example to change power to electrical windings 1815 at the remaining sections 1803 for pitch control; the computing device 1920 may further control a levitation engine, also attached to the vehicle to which the electromagnetic actuator 1802 is attached, for further pitch control. Put another way, the vehicle, and the like, to which the electromagnetic actuator 1802 is attached may include one or more levitation engines, which may also be controlled by the computing device 1920 and/or another computing device in communication with the computing device 1920, to control pitch at the vehicle. Similarly, the vehicle, and the like, to which the electromagnetic actuator 1802 is attached may include one or more other electromagnetic actuators, similar to the electromagnetic actuator 1802, which may also be controlled by the computing device 1920 and/or another computing device in communication with the computing device 1920, to control pitch at the vehicle. As such, when a failure occurs at a section 1803, as described above, the computing device 1920, and/or a combination of computing devices at the vehicle to which the electromagnetic actuator 1802 is attached, may control the remaining sections 1803 that have not failed, and one or more levitation engines and/or one or more other electromagnetic actuators, to control pitch of the vehicle that may occur due to the failure. Put another way, the remaining sections 1803 that have not failed may be controlled asymmetrically, and one or more levitation engines, and/or sections of other electromagnetic actuators, may be controlled to counteract a pitch moment of the vehicle (e.g., under any suitable conditions).

As depicted, the sections 1803 of the electromagnetic actuator 1802 are further adapted to include the temperature sensors 1902, which may be used to, more specifically, determine which sections 1803 have failed. Again, while only two temperature sensors 1902 are indicated, one at sections 1803 at each end 1831, 1832, it is understood that each section 1803 may include a respective temperature sensor 1902, represented as triangles in FIG. 19. For example, the temperature sensors 1902 may comprise thermocouples attached to ends of electrical windings 1815 of a section 1803. Hence, the temperature sensors 1902 are generally configured to measure respective temperature of one or more of the sections 1803, respective electrical windings 1815 of the sections 1803 and respective ends of the electrical windings 1815 of the sections 1803.

Such ends of electrical windings 1815 tend to be hotspots for the sections 1803 (e.g., as they are not in contact with pole portions 1809 and/or cold plates, etc., and/or are physically furthest from such components at a section 1803). Hence the temperature sensors 1902 positioned in such a manner may be used to detect failures and/or potential failures of the sections 1803 and/or electrical windings 1815, which are generally accompanied by a change and/or rise in temperature of the electrical windings 1815.

In particular, the temperature sensors 1902 are communicatively coupled to the computing device 1920, which may receive signals from the temperature sensors 1902, which represent measured temperatures, and responsively control power to the sections 1803, and/or electrical windings 1815 thereof, based on measured temperature and/or based on detecting when a failure occurs and/or based on determining when a failure may occur (e.g., as indicated by a rise in temperature at a rate associated with failures). Put another way, the computing device 1920 may be configured to control power to the electrical windings 1815 based on respective temperatures measured by the one or more temperature sensors 1902.

In some examples, the computing device 1920 may detect when a temperature of a section 1803 rises above a threshold temperature, and cut power to the electrical windings 1815 of the section 1803 (e.g., by cutting power to a power source 1922 and/or an HVI) to prevent shorting and/or damage thereto. However, as described above, such cutting of power to electrical windings 1815 of the section 1803 may also result in cutting power to electrical windings 1815 of another section 1803 (e.g., due to the symmetry about the center line 1854 of wiring to the BCMs) so that a symmetrical change to a pitch moment of force and/or inertia occurs.

In some examples, the computing device 1920 may receive, and store at a memory, values of signals from the temperature sensors 1902 (e.g., in a time series) to generally monitor a health of a section 1803 and/or an electrical winding 1815 thereof, for example, by logging (e.g., at a memory) temperatures to which the electrical windings 1815 were exposed, which may generally be used to predict when an electrical windings 1815 may fail.

Hence, for example, the computing device 1920 may use such logged temperatures to detect and/or predict a failure of an electrical winding 115 and control a notification device (e.g., of a technician and/or a driver of a vehicle to which the electromagnetic actuator 1802 is attached) of a such a failure and/or predicted failure. Furthermore, the computing device 1920 may be provided with temperature-based criteria indicating when electrical windings 1815 are to be replaced; when such temperature-based criteria are met, as determined via temperatures measured with the temperature sensors 1902, the computing device 1920 may control a notification device accordingly.

While not depicted, as failures of electrical windings 1815 may lead to changes in current, as well as changes in temperature, in an electrical winding 1815, the electromagnetic actuator 1802 may be further provided with ammeters (e.g., communicatively coupled to the computing device 1920), and the like, for measuring current in electrical windings 1815 of the sections 1803 to determine and/or predict failures; such ammeters may be located in the BCMs.

As previously described, the electromagnetic actuators 102, 1802 may be used to brake a vehicle to which they are attached at high speed and/or in emergency situations; the vehicle is understood to further comprise a propulsion system and/or a magnetic propulsion system, which may also brake the vehicle under "normal" operation and/or in non-emergency situations (e.g., using regenerative braking, which may be used to charge batteries at the vehicle). However, in some examples, the braking of the propulsion system may degrade, and the like, and/or regenerative braking may not be suitable (e.g., as the batteries of the vehicle may be close to fully charged, and/or in a state where further charging may not be possible, and the like) and the electromagnetic actuators 102, 1802 may be used to assist and/or supplement the braking of the propulsion system, and/or the electromagnetic actuators 102, 1802 may be used to assist and/or supplement the braking of the propulsion system in any suitable situation.

Such supplemental braking may cause electrical windings of the electromagnetic actuators 102, 1802 to increase in temperature. As mentioned above, electrical windings of the electromagnetic actuators 102, 1802 may have a maximum recommended operating temperature, and hence, when the electromagnetic actuators 102, 1802 are used for supplemental braking, the temperature sensors 1902 may be used to reserve temperature overhead for electrical windings of the electromagnetic actuators 102, 1802 so that the electromagnetic actuators 102, 1802 may also be used for an emergency braking event.

For example, the computing device 1920 may control power to electrical windings 1815 of the electromagnetic actuator 1802 to perform supplemental braking to assist braking of a propulsion system, and monitor the temperature of the electrical windings 1815 via the temperature sensors 1902. When the temperature sensors 1902 indicate that the temperature of the electrical windings 1815 reaches a threshold temperature, that is below a maximum recommended operating temperature, the computing device may use one or more of: reduce and/or turn off power to electrical windings 1815 of the electromagnetic actuator 1802 to reduce and/or turn off supplemental braking; reduce power to the propulsion system to reduce speed of the vehicle; control an electromagnetic levitation engine and/or an electromagnetic guidance engine of the vehicle into a braking mode; and/or control any other suitable devices and/or engines of the vehicle to brake the vehicle. These examples, and the following examples, assume that the computing device 1920 also controls the propulsion system and/or other engines and/or components of the vehicle to which the electromagnetic actuator 1802 is attached, though it is understood that such a vehicle may comprise a plurality of computing devices for controlling such components, which may be in communication with each other to coordinate control of the vehicle.

In general, a difference between a threshold temperature, at which supplemental braking is reduced and/or turned off, and a maximum recommended operating temperature, represents a temperature difference through which the electrical windings 1815 may increase and still effectively brake the vehicle in an emergency situation (e.g., such a temperature difference represents how much heat can be input into the electrical windings 1815 during an emergency braking event). Furthermore, the threshold temperature may depend on velocity of the vehicle, with the threshold temperature being lowered as the velocity increases, and vice versa, as more heat may be produced in an emergency braking event at high speeds.

Similarly, the computing device 1920 (and the like) may set an upper limit on a velocity of a vehicle to which the electromagnetic actuator 1802 is attached based on temperature of the electrical windings 1815 measured by the temperature sensors 1902, for example to ensure there is sufficient thermal overhead for emergency braking (e.g., regardless of whether supplemental braking is occurring, or not). The upper limit on the velocity of the vehicle may decrease as the temperature of the electrical windings 1815 increases, and vice versa.

The gap sensors 1903 may comprise laser gap sensors positioned on the vehicle to which the electromagnetic actuator 1802 is attached and/or at the track 101 and/or a tube and the like, to which the track 101 is mounted. The gap sensors 1903 generally measure a distance between pole faces of the pole portions 1809 and the track segments 105 of the track 101. Put another way, the gap sensors 1903 measure a flight plane of the vehicle, to which the electromagnetic actuator 1802 is attached, relative to the track 101.

However, when a gap sensor 1903 is aligned with a longitudinal gap 1952 between the track segments 105, the gap sensor 1903 may not measure a distance therebetween. As such, a number of the gap sensors 1903 and positions of the gap sensors 1903 are selected such that at least three gap sensors 1903 are measuring a distance between pole faces of the pole portions 1809 and the track segments 105 of the track 101 at any given time; put another way, a number of the gap sensors 1903 and positions of the gap sensors 1903 are selected such that at least three gap sensors 1903 are not aligned with a longitudinal gap 1952 at any given time. As such, as depicted, six gap sensors 1903 are provided, which are staggered along either side 1821, 1822, between the ends 1831, 1832, of the electromagnetic actuator 1802 at positions selected as described above. However, as few as four gap sensors 1903, with respective positions selected accordingly, may be used to ensure that at least three of the four gap sensors 1903 are measuring a distance between pole faces of the pole portions 1809 and the track segments 105 of the track 101 at any given time.

It is furthermore understood that, as described above with respect to the electromagnetic actuator 102, a plurality of the electromagnetic actuators 1802 may be distributed on a vehicle with respective gap sensors 1903 provided for the electromagnetic actuators 1802. As such, signals representing measurement of the gap sensors 1903 for the plurality of the electromagnetic actuators 1802 may be received at the computing device 1920 to determine a plane of the vehicle relative to the track 101. When the measurements indicate that the plane of the vehicle is not parallel to the track 101, and/or meets any other suitable conditions, the computing device 1920, and the like, may control a levitation engine and/or guidance engine and/or propulsion engine accordingly, in a feedback loop with the gap sensors 1903 to bring, and maintain, the plane of the vehicle parallel to the track 101. Hence, the computing device 1920 may be configured to control a distance between pole faces of the pole portions 1809 and the track segments 105 of the track 101 based on measurements by the one or more gap sensors 1903.

Other sensors may be provided external to the electromagnetic actuator 1802, which may be used to control the electromagnetic actuator 1802, and the like. For example, track temperature sensors may be deployed, at the vehicle to which the electromagnetic actuator 1802 is attached, and/or along the track 101. When track temperature sensors are deployed at the vehicle to which the electromagnetic actuator 1802 is attached, such track temperature sensors may comprise infrared temperature sensors. When track temperature sensors are deployed along the track 101, such track temperature sensors may comprise thermocouples combined with wireless transceivers to wirelessly communicate with the computing device 1920.

Measurements from such track temperature sensors may be used to determine temperatures of the track 101, which may be related to changes in magnetic flux behavior and/or changes in eddy current behavior in the track 101; such changes may be related to temperature as stored in a lookup table at the computing device 1920. The computing device 1920 may responsively control braking of the electromagnetic actuator 1802 to account and/or compensate for such changes in magnetic flux behavior and/or changes in eddy current behavior in the track 101 due to temperature of the track 101 measured by the track temperature sensors. In a particular example, when a convoy of vehicles is moving along the track 101, track temperature can increase between the first vehicle and the last vehicle; as such, braking using electromagnetic actuators 1802 at the first vehicle may occur differently from braking using electromagnetic actuators 1802 at the last vehicle (e.g., the respective computing devices 1920 of the vehicles may differently control power to respective electromagnetic actuators 1802 based on track temperature).

It is further understood that any features of any of the electromagnetic actuators provided herein may be combined in any suitable manner with features of other electromagnetic actuators provided herein.

In this specification, components may be described as "configured to" perform one or more functions or "configured for" such functions. In general, a component that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XY, YZ, XZ, and the like). Similar logic can be applied for two or more items in any occurrence of "at least one . . . " and "one or more . . . " language.

The terms "about", "substantially", "essentially", "approximately", and the like, are defined as being "close to", for example as understood by persons of skill in the art. In some examples, the terms are understood to be "within 10%," in other examples, "within 5%", in yet further examples, "within 1%", and in yet further examples "within 0.5%".

Persons skilled in the art will appreciate that in some examples, the functionality of computing devices (e.g., computing devices 720, 1920) and/or methods and/or processes described herein can be implemented using preprogrammed hardware or firmware elements (e.g., an application specific integrated circuit (ASIC), a Field Programmable Gate Array (FPGA), a programmable array logic (PAL), a programmable logic array (PLA), a programmable logic device (PLD), electrically erasable programmable read-only memories (EEPROMs), etc.), or other related components. In other examples, the functionality of the computing devices and/or methods and/or processes described herein can be achieved using a computing apparatus that has access to a code memory (not shown), which stores computer-readable program code for operation of the computing apparatus. The computer-readable program code could be stored on a computer readable storage medium, which is fixed, tangible and readable directly by these components, (e.g., removable diskette, CD-ROM (Compact Disc-Read-Only Memory), ROM (Read-Only Memory), fixed disk, USB (Universal Serial Port) drive, optical drive, and the like). Furthermore, it is appreciated that the computer-readable program can be stored as a computer program product comprising a computer usable medium. Further, a persistent storage device can comprise the computer readable program code. It is yet further appreciated that the computer-readable program code and/or computer usable medium can comprise a non-transitory computer-readable program code and/or non-transitory computer usable medium. Alternatively, the computer-readable program code could be stored remotely but transmittable to these components via a modem or other interface device connected to a network (including, without limitation, the Internet) over a transmission medium. The transmission medium can be either a non-mobile medium (e.g., optical and/or digital and/or analog communications lines) or a mobile medium (e.g., microwave, infrared, free-space optical or other transmission schemes) or a combination thereof. Furthermore, such computing devices (e.g., computing devices 720, 1920) and/or methods and/or processes described herein may be implemented using "engines", which may be understood to include hardware (e.g., implemented as an ASIC, an FPGA, a PAL, a PLA, a PLD etc.), and/or a combination of hardware and software (e.g., a combination of hardware and software includes software hosted at hardware, such as a software module that is stored at a processor-readable memory implemented or interpreted by a processor), or hardware and software hosted at hardware.

Persons skilled in the art will appreciate that there are yet more alternative examples and modifications possible, and that the above examples are only illustrations of one or more examples. The scope, therefore, is only to be limited by the claims appended hereto.

What is claimed is:

1. An electromagnetic actuator for braking, the electromagnetic actuator comprising:
pole portions extending from one or more back-iron portions, respective longitudinal axes of the pole portions arranged substantially parallel to one another and substantially perpendicular to a common movement axis,
wherein a pole pitch of the pole portions is selected: to induce eddy currents in an associated segmented track, such that the eddy currents are present in a skin depth at more than one surface of segments of the associated segmented track when the pole portions are moving at given speeds; and such that eddy current generated losses occupy substantially an entirety of a volume of a segment below a given intermediate speed, and the eddy current generated losses occupy at least one third of the volume of the segment at a given maximum speed greater than the given intermediate speed, and
electrical windings, wherein an electrical winding is around a respective pole portion, the electrical windings being individually controllable.

2. The electromagnetic actuator of claim 1, wherein a length of the pole portions along longitudinal axes is selected to be equal or larger than a width of the associated segmented track, the longitudinal axes being parallel to the width of the associated segmented track.

3. The electromagnetic actuator of claim 1, wherein a length of the pole portions along longitudinal axes is selected to be at least two times a pole pitch of the pole portions.

4. The electromagnetic actuator of claim 1, wherein the electrical windings are controllable by a computing device having access to one or more sensors configured to detect a speed of the pole portions relative to the associated segmented track, the computing device configured to control, using the electrical windings, and based on a speed of the pole portions, one or more of:
polarity of the pole portions;
magnetic flux of the pole portions;
braking forces;
normal forces; and
pitch moments.

5. The electromagnetic actuator of claim 4, wherein the computing device is further configured to:
below a given speed, control the polarity of the pole portions such that adjacent pole portions have alternate polarities; and
above the given speed, control the polarity of the pole portions such that the adjacent pole portions are arranged in respective groups, with adjacent respective groups having alternate polarities.

6. The electromagnetic actuator of claim 5, wherein a number of the pole portions in the respective groups increases with the speed.

7. The electromagnetic actuator of claim 1, further comprising one or more magnetic flux sensors configured to measure magnetic flux of the pole portions, wherein the electrical windings are controllable by a computing device communicatively coupled to the magnetic flux sensors, and the computing device is configured to control one or more of braking and normal forces at one or more of across the electromagnetic actuator and at the pole portions, based on the magnetic flux measured by the magnetic flux sensors.

8. The electromagnetic actuator of claim 1, further comprising one or more temperature sensors configured to measure respective temperature of one or more the electrical windings and respective ends of the electrical windings, wherein the electrical windings are controllable by a computing device communicatively coupled to the one or more temperature sensors, and the computing device is configured to control power to the electrical windings based on respective temperatures measured by the one or more temperature sensors.

9. A track for an electromagnetic actuator, the track comprising:
   segments arranged along a movement axis, each of the segments comprising a solid ferromagnetic material electrically insulated from one another;
   low-speed regions comprising low-speed segments;
   high-speed regions comprising high-speed segments, and
   low-speed region s comprising transitional segments, a transitional region located between a low-speed region and a high-speed region,
   wherein the high-speed segments are smaller than the low-speed segments, and the transitional segments are larger than the high-speed segments and smaller than the low-speed segments.

10. The track of claim 9, wherein the track is segmented one or more of perpendicular to the movement axis, and parallel to the movement axis.

11. The track of claim 9, wherein the segments are one or more of rectangular, square, trapezoidal, rhombus-shaped, triangular, skewed, and curved.

12. The track of claim 9, wherein a respective thickness of respective segments of the low-speed regions, the high-speed regions and the transitional regions is at least two times a minimum eddy current skin depth when pole portions of the electromagnetic actuator are moving at a given respective maximum velocity for a respective region.

13. The track of claim 9, wherein a thickness of the high-speed segments is less than or equal to a respective thickness of the low-speed segments.

14. The track of claim 9, wherein a thickness of the transitional segments is between respective thicknesses of the low-speed segments and the high-speed segments.

15. The track of claim 9, wherein dimensions of the segments are selected such that a braking force on the electromagnetic actuator, due to eddy currents induced in the segments by the electromagnetic actuator, is substantially constant above a given speed of the electromagnetic actuator.

16. A system for braking comprising:
   a track; and
   an electromagnetic actuator for braking, the electromagnetic actuator arranged such that the electromagnetic actuator moves along a movement axis of the track, with a gap therebetween,
   the track comprising: segments arranged along the movement axis, each of the segments comprising a solid ferromagnetic material,
   the electromagnetic actuator comprising:
      pole portions extending from one or more back-iron portions, respective longitudinal axes of the pole portions arranged substantially parallel to one another and substantially perpendicular to a common movement axis,
      wherein a pole pitch of the pole portions is selected: to induce eddy currents in the segments of the track, such that the eddy currents are present in a skin depth at more than one surface of the segments of the track when the pole portions are moving at given speeds; and such that eddy current generated losses occupy substantially an entirety of a volume of a segment below a given intermediate speed, and the eddy current generated losses occupy at least one third of the volume of the segment at a given maximum speed greater than the given intermediate speed, and
      electrical windings, wherein an electrical winding is around a respective pole portion, the electrical windings being individually controllable.

17. The system of claim 16, wherein one or more of the pole pitch and a track segment pitch, parallel to the movement axis, is selected to reduce force ripple as the electromagnetic actuator moves along the segments of the track.

18. The system of claim 16, wherein the electromagnetic actuator comprises a given number of the pole portions, and a track segment pitch, parallel to the movement axis, is determined from the pole pitch, and a ratio of the given number of the pole portions to an integer number of the segments in which the given number of the pole portions is inducing the eddy currents, wherein the integer number of the segments is selected such that a Greatest Common Divisor (GCD) between the given number of the pole portions and the integer number of the segments is one or more of: 1; and as small of an integer value as possible.

19. The system of claim 16, further comprising:
   one or more gap sensors configured to measure a distance between pole faces of the pole portions and the segments of the track; and
   a computing device communicatively coupled to the one or more gap sensors, the computing device configured to control the distance between the pole faces and the segments based on measurements by the one or more gap sensors.

* * * * *